US009225351B2

(12) United States Patent
Itakura et al.

(10) Patent No.: US 9,225,351 B2
(45) Date of Patent: Dec. 29, 2015

(54) CURRENT AMPLIFIER CIRCUIT, INTEGRATOR, AND AD CONVERTER

(71) Applicant: Kabushiki Kaisha Toshiba, Minato-ku, Tokyo (JP)

(72) Inventors: Tetsuro Itakura, Tokyo (JP); Masanori Furuta, Kanagawa (JP); Akihide Sai, Kanagawa (JP); Junya Matsuno, Kanagawa (JP); Yohei Hatakeyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/538,212

(22) Filed: Nov. 11, 2014

(65) Prior Publication Data

US 2015/0130647 A1    May 14, 2015

(30) Foreign Application Priority Data

Nov. 13, 2013 (JP) ................................. 2013-235298
Oct. 22, 2014 (JP) ................................. 2014-215707

(51) Int. Cl.
*H03M 1/12* (2006.01)
*H03M 1/00* (2006.01)
*H03F 3/45* (2006.01)
(Continued)

(52) U.S. Cl.
CPC ............ *H03M 1/002* (2013.01); *H03F 3/45273* (2013.01); *H03M 1/0604* (2013.01); *H03F 2200/267* (2013.01); *H03F 2203/45034* (2013.01); *H03M 1/00* (2013.01); *H03M 1/12* (2013.01); *H03M 1/365* (2013.01)

(58) Field of Classification Search
CPC .......... H03M 1/12; H03M 1/00; H03M 1/365
USPC .................. 341/155, 156, 158, 159, 120, 160
See application file for complete search history.

(56) References Cited

U.S. PATENT DOCUMENTS 6,888,482 B1 * 5/2005 Hertle ........................... 341/120

FOREIGN PATENT DOCUMENTS

JP    H06-260850 A    9/1994
JP    2001-085953 A    3/2001

OTHER PUBLICATIONS

B. Razavi, "Principles of Data Conversion System Design," Wiley—IEEE Press, Sec. 6.7 Successive Approximation Architectures, pp. 143-147.

(Continued)

*Primary Examiner* — Joseph Lauture
(74) *Attorney, Agent, or Firm* — Knobbe, Martens, Olson & Bear LLP

(57) ABSTRACT

In one embodiment, a current amplifier circuit includes a first transistor, a first resistor, a second transistor, a second resistor, a first passive element, and a control circuit. The first transistor has a first terminal, a second terminal, and a control terminal. The first resistor has one end connected to the first terminal of the first transistor. The second transistor has a first terminal, a second terminal, and a control terminal. The second resistor has one end connected to the first terminal of the second transistor. The first passive element is connected between the first terminals of the first transistor and the second transistor. The control circuit controls at least one of voltage at the control terminals of the first transistor and the second transistor such that the voltage at the other end of the first resistor becomes equal to the voltage at the other end of the second resistor.

19 Claims, 31 Drawing Sheets

(51) Int. Cl.
*H03M 1/06* (2006.01)
*H03M 1/36* (2006.01)

(56) References Cited

OTHER PUBLICATIONS

P.E. Allen, et al., "CMOS Analog Circuit Design," The Oxford Series in Electrical and Computer Engineering, pp. 709-710 (*Implementation of Delta-Sigma Modulators*).

Y. M. Lin, et al., "A13-b 2.5-MHz Self-Calibrated Pipelined A/D Converter in 3- μm CMOS," JSSC, vol. 26, No. 4, Apr. 1991.

Y. Chiu, et al., "A 14-b 12-MS/s CMOS Pipeline ADC With Over 100-dB SFDR," IEEE Journal of Solid State Circuits, vol. 39, No. 12, pp. 2139-2151, Dec. 2004.

J. Choen, et al., "Noise Analysis and Simulation Method for a Signle-Slope ADC with CDS in a CMOS Image Sensor," pp. 2980-2987, IEEE TCAS-I, vol. 55, No. 10, Nov. 2008.

* cited by examiner

CURRENT AMPLIFIER CIRCUIT, INTEGRATOR, AND AD CONVERTER

CROSS REFERENCE TO RELATED APPLICATION(S)

This application is based upon and claims the benefit of priority from the prior Japanese Patent Application No. 2013-235298, filed on Nov. 13, 2013, and prior Japanese Patent Application No. 2014-215707, filed on Oct. 22, 2014, the entire contents all of which are incorporated herein by reference.

FIELD

Embodiments described herein relate generally to a current amplifier circuit, integrator, and AD converter.

BACKGROUND

In the related art, there are cases in which a sensor that detects a state of an object by changing a resistance value has a small change rate of the resistance value, such as one percent, corresponding to a state change. In the case of using such a sensor, a change of resistance value is converted to an electrical signal and then the electrical signal is amplified by an amplifier circuit. In the case where the change of the resistance value is converted to current, a current amplifier circuit is used. However, the current amplifier circuit in the related art, there is a problem in which most of bias current is consumed.

For example, it is known that a current mirror circuit is used as the current amplifier circuit in the related art. In the case of using this kind of current amplifier circuit, the change of the resistance value is converted to the current at first. Provided that the change rate of the resistance value is $\Delta_R$ and the bias current is $I_b$, the converted current becomes: $I_b(1+\Delta_R)$. In other words, the change of the resistance value is converted to the current in which signal current $I_b\Delta_R$ is superimposed on the bias current $I_b$.

The converted current is received in the current mirror circuit and amplified by a multiple of a device size ratio. Here, when the device size ratio is K, the current amplified by the current mirror circuit is $KI_b(1+\Delta_R)$. In this case, a ratio between the bias current consumed in an entire circuit and signal current to be output (hereinafter referred to as "ratio between the bias current and the signal current") is: $KI_b\Delta_R/(I_b+KI_b)=K\Delta_R/(1+K)$. Since normally K is a value of one or larger, the ratio between the bias current and the signal current $K\Delta_R/(1+K)$ becomes $\Delta_R$ or less. Thus, the signal current becomes K-fold, but the bias current is also increased, thereby not improving the ratio between the bias current and the signal current.

As a method of improving the above situation, there is a proposed method in which the ratio between the bias current and the signal current is improved by subtracting predetermined current $I_{b1}$ from the converted current $I_b(1+\Delta_R)$ before being received in the current mirror circuit. According to such a current amplifier circuit, output of the current mirror circuit becomes: $K(I_b-I_{b1}+I_b\Delta_R)$. Therefore, the ratio between the bias current and the signal current becomes: $KI_b\Delta_R/\{I_b+K(I_b-I_{b1})\}$.

For example, in the case where $I_b=200\,\mu A$, $\Delta_R=0.01$ (=1%), $I_{b1}=197.8\,\mu A$, and K=80, total bias current becomes 376 μA (=200 μA+80×(200 μA−197.8 μA)), and the signal current becomes 160 μA (=80×200 μA×0.01). Therefore, the ratio between the bias current and the signal current is: 160/376=0.43.

DETAILED DESCRIPTION

Embodiments will now be explained with reference to the accompanying drawings. The present invention is not limited to the embodiments.

In one embodiment, a current amplifier circuit includes a first transistor, a first resistor, a second transistor, a second resistor, a first passive element, and a control circuit. The first transistor has a first terminal, a second terminal, and a control terminal. The first resistor has one end connected to the first terminal of the first transistor. The second transistor has a first terminal, a second terminal, and a control terminal. The second resistor has one end connected to the first terminal of the second transistor. The first passive element is connected between the first terminal of the first transistor and the first terminal of the second transistor. The control circuit controls at least one of voltage at the control terminal of the first transistor and voltage at the control terminal of the second transistor such that the voltage at the other end of the first resistor becomes equal to the voltage at the other end of the second resistor.

The current amplifier circuit amplifies a differential signal received from input terminals $T_1$ (first input terminal) and $T_2$ (second input terminal), and executes output from output terminals $T_3$ and $T_3$. In the following, a current amplifier circuit formed of a MOS transistor will be described, but the current amplifier circuit can be also formed of a bipolar transistor. The current amplifier circuit can be formed of the bipolar transistor by substituting the MOS transistor described below with the bipolar transistor and further substituting a source terminal with an emitter terminal, a drain terminal with a collector terminal, and a gate terminal with a base terminal.

Further, in the following, an embodiment mainly using an N-channel MOS transistor will be described, but it is also possible to configure a current amplifier circuit mainly using a P-channel MOS transistor or a PNP type bipolar transistor. The current amplifier circuit mainly using the P-channel MOS transistor or the PNP type bipolar transistor can be formed by substituting the N-channel (P-channel) MOS transistor described below with the P-channel (N-channel) MOS transistor or with the PNP type (NPN type) bipolar transistor, and connecting a terminal connected to a ground (power source) to the power source (ground).

(First Embodiment)

Figure 1:
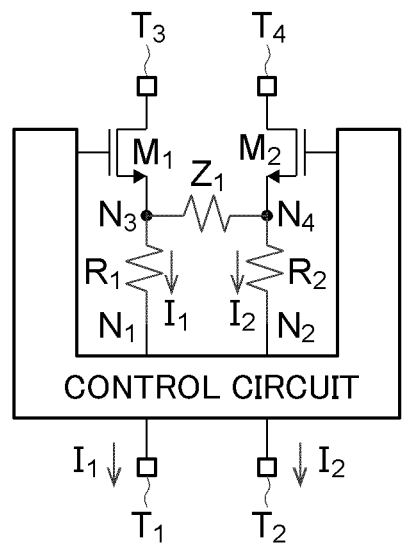
FIG. 1 is a diagram illustrating a current amplifier circuit according to a first embodiment.

In the following, a current amplifier circuit according to a first embodiment will be described with reference to FIGS. 1 to 17. Here, FIG. 1 is a diagram illustrating the current amplifier circuit according to the first embodiment. As illustrated in FIG. 1, the current amplifier circuit according to the present embodiment includes a transistor $M_1$, a resistor $R_1$, a transistor $M_2$, a resistor $R_2$, a passive element $Z_1$, and a control circuit.

The transistor $M_1$ (first transistor) is an N-channel MOS transistor (hereinafter referred to as "NMOS transistor"). The transistor $M_1$ has a source terminal (first terminal) connected to the resistor $R_1$ and the passive element $Z_1$ at a node $N_3$, a drain terminal (second terminal) connected to an output terminal $T_3$, and a gate terminal (control terminal) connected to the control circuit. The voltage at the gate terminal of the transistor $M_1$ is controlled by the control circuit, and drain current $I_{M1}$ flows in the transistor $M_1$.

One end of the resistor $R_1$ (first resistor) is connected to the source terminal of the transistor $M_1$ and the passive element $Z_1$ at the node $N_3$, and the other end is connected to the control circuit at a node $N_1$. The resistor $R_1$ may be a fixed resistor having a constant resistance value, or may also be a sensor device that detects a state of an object by change of the resistance value.

The transistor $M_2$ (second transistor) is an NMOS transistor. The transistor $M_2$ has a source terminal (first terminal) connected to the resistor $R_2$ and the passive element $Z_1$ at a node $N_4$, a drain terminal (second terminal) connected to an output terminal $T_4$, and a gate terminal (control terminal) connected to the control circuit. The voltage at the gate terminal of the transistor $M_2$ is controlled by the control circuit, and drain current $I_{M2}$ flows in the transistor $M_2$.

One end of the resistor $R_2$ (second resistor) is connected to a source terminal of the transistor $M_2$ and the passive element $Z_1$ at the node $N_4$, and the other end is connected to the control circuit at a node $N_2$. The resistor $R_2$ may be a fixed resistor having a constant resistance value, or may also be a sensor device that detects a state of an object by change of the resistance value. Meanwhile, in the case where the resistor $R_1$ has the fixed resistor, preferably the resistor $R_2$ has the fixed resistor having a resistance value equal to the resistance value of the resistor $R_1$ ($R_1 = R_2$). Additionally, in the case where the resistor $R_1$ is the sensor device, preferably the resistor $R_2$ is the sensor device having a same absolute value with an opposite sign of a change rate of the resistance value of the resistor $R_1$ as next: ($R_1 = R_C(1-\Delta_R)$, and $R_2 = R_C(1+\Delta_R)$).

The passive element $Z_1$ (first passive element) is connected to the source terminal of the transistor $M_1$ and one end of the resistor $R_1$ at the node $N_3$, and further connected to the source terminal of the transistor $M_2$ and one end of the resistor $R_2$ at the node $N_4$. The passive element $Z_1$ may be formed of resistor or capacitor. For example, the passive element $Z_1$ may be formed of resistor and capacitor connected in series. In this case, when a frequency of an input signal is low, impedance element $Z_1$ of the passive element $Z_1$ is substantially determined by a capacitance component, and when the frequency is high, the impedance element $Z_1$ is substantially determined by a resistance component. Thus, the impedance element $Z_1$ may include frequency characteristic.

The control circuit is connected to the gate terminal of the transistor $M_1$, the gate terminal of the transistor $M_2$, the other end of the resistor $R_1$, the other end of the resistor $R_2$, and the input terminals $T_1$ and $T_2$. The control circuit controls at least one of the voltage at the gate terminal of the transistor $M_1$ and the voltage at the gate terminal of the transistor $M_2$ such that voltage $V_1$ (first predetermined voltage) at the other end of the resistor $R_1$ becomes equal to voltage $V_2$ (second predetermined voltage) at the other end of the resistor $R_2$, more specifically, the voltage $V_1$ at the node $N_1$ becomes equal to the voltage $V_2$ at the node $N_2$. Further, the control circuit executes control such that current $I_1$ received from the input terminal $T_1$ is applied to the resistor $R_1$ and current $I_2$ received from input terminal $T_2$ is applied to the resistor $R_2$.

Next, operation of the current amplifier circuit according to the present embodiment will be described. In the following description, note that the resistor $R_1$ and the resistor $R_2$ are the fixed resistor: $R_1 = R_2 = R_C$, and the passive element $Z_1$ is resistor. Further, the voltage $V_1$ and voltage $V_2$ at the nodes $N_1$ and $N_2$ are controlled to be $V_C$ by the control circuit ($V_1 = V_2 = V_C$). Additionally, the current $I_1$ and the current $I_2$ are differential signals which are: $I_1 = I_b(1+\Delta_R)$, and $I_2 = I_b(1-\Delta_R)$. In other words, a description will be given for a case in which the current amplifier circuit is connected to the sensor device, and signal current is differentially received from the terminals $T_1$ and $T_2$.

When the current $I_1$ and current $I_2$ are received from the input terminals $T_1$ and $T_2$, voltage $V_3$ at the node $N_3$ and voltage $V_4$ at the node $N_4$ become: $V_3=V_1+R_1I_1$ and $V_4=V_2+R_2I_2$. Here, in the case of plugging following values ($R_1=R_2=R_C$, $I_1=I_b(1+\Delta_R)$, $I_2=I_b(1-\Delta_R)$, and $V_1=V_2=V_C$) into the mentioned formula, the voltage $V_3$ and $V_4$ become: $V_3=V_C+R_CI_b+R_CI_b\Delta_R$ and $V_4=V_C+R_CI_b-R_CI_b\Delta_R$.

Accordingly, the voltage of $V_3-V_4=2R_CI_b\Delta_R$ is applied to the passive element $Z_1$, and following current $I_{Z1}$ flows: $I_{Z1}=2R_CI_b\Delta_R/Z_1$. Due to this, the current $I_{M1}$ flowing in the transistor $M_1$ becomes: $I_{M1}=I_1+I_{Z1}=I_b+\Delta_RI_b+2R_CI_b\Delta_R/Z_1$. The current $I_{M2}$ flowing in the transistor $M_2$ becomes: $I_{M2}=I_2-I_{Z1}=I_b-\Delta_RI_b-2R_CI_b\Delta_R/Z_1$. According to the present embodiment, the current $I_{M1}$ and current $I_{M2}$ are the output signals to be output from the output terminals $T_3$ and $T_4$.

Here, note that bias current $I_B$ flowing in the entire circuit is a sum of bias current contained in the output signals (current $I_{M1}$ and $I_{M2}$), and therefore the bias current $I_B$ becomes: $I_B=2I_b$. This is equal to a sum of the bias current contained in the input signals (current $I_1$ and $I_2$). In other words, according to the present embodiment, the bias current contained in the input signal is not amplified.

On the other hand, signal current $I_{SIG}$ output from the current amplifier circuit is a difference between the two output signals (current $I_{M3}$ and $I_{M4}$), and therefore the signal current becomes: $I_{SIG}=I_{M1}-I_{M2}=2\Delta_RI_b+4R_CI_b\Delta_R/Z_1$.

For example, in the case of $R_C=4$ kΩ, $\Delta_R=0.01$, $I_b=100$ μA, and $Z_1=100$Ω, the signal current contained in the input signal becomes: $I_1-I_2=2I_b\Delta_R=2$ μA. The signal current $I_{SIG}$ contained in the output signal becomes: $I_{SIG}=162$ μA. In other words, the signal current is amplified 81-fold. Further, the bias current $I_B$ consumed in the current amplifier circuit becomes: $I_B=200$ μA, and the ratio between the bias current and the signal current becomes 0.81. Thus, the ratio between the bias current and the signal current in the current amplifier circuit according to the present embodiment becomes larger than the ratio between the bias current and the signal current in the current amplifier circuit according to the related art.

As described above, in the current amplifier circuit according to the present embodiment, the voltage ($V_3-V_4$) corresponding to the signal current contained in the input signal is applied to the passive element $Z_1$, thereby allowing the current $I_{Z1}$ corresponding to the signal current to flow in the passive element $Z_1$. The signal current is amplified and amplification of the bias current can be suppressed by adding the current $I_{Z1}$ to the input signals ($I_1$, $I_2$) and generating the output signals. In this manner, the ratio between the bias current and the signal current can be improved and power consumption in the current amplifier circuit can be suppressed, compared to the current amplifier circuit in the related art.

Meanwhile, in the current amplifier circuit, only the bias current may be received from one of the input terminals $T_1$ and $T_2$. For example, the input signals may be: $I_1=I_b(1+\Delta_R)$ and $I_2=I_b$. In this case, the signal current to be received is: $I_1-I_2=I_b\Delta_R=1$ μA. The signal current to be output is: $I_{SIG}=\Delta_RI_b)+2R_CI_b\Delta_R/Z_1=81$ μA. In other words, an amplification factor of the signal current is same as the case where both input signals contain the signal current. In this case, the bias current in the entire current amplifier circuit is: $I_B=2I_b=200$ μA. Therefore, the ratio between the bias current and the signal current becomes 0.405.

(First Working Example)

Figure 2:
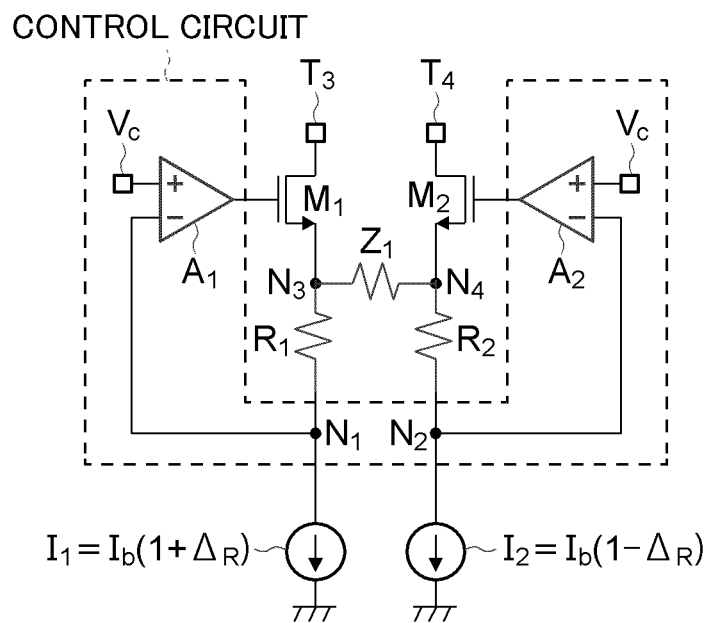
FIGS. 2 to 17 are diagrams illustrating respective working examples according to the first embodiment.

FIG. 2 is a diagram illustrating a first working example according to the present embodiment. In the present working example, the current amplifier circuit includes an amplifier circuit $A_1$ and an amplifier circuit $A_2$ as the control circuits. The amplifier circuit $A_1$ ($A_2$) has a positive input terminal from which predetermined voltage $V_C$ is applied, and a negative input terminal connected to the other end of the resistor $R_1$ ($R_2$) at the node $N_1$ ($N_2$), and an output terminal connected to the gate terminal of the transistor $M_1$ ($M_2$). Further, the input signals $I_1$ and $I_2$ are received from current sources $I_1$ and $I_2$. Note that, in the following, the input terminals $T_1$ and $T_2$ correspond to the nodes $N_1$ and $N_2$ unless otherwise specified.

Now, operation of the control circuit according to the present working example will be described. The amplifier circuit $A_1$ forms a feedback circuit together with the transistor $M_1$ and the resistor $R_1$, and executes feedback control such that voltage at the positive terminal and negative terminal in the amplifier circuit $A_1$ become equal. More specifically, the amplifier circuit $A_1$ controls the voltage at the gate terminal of the transistor $M_1$ such that the voltage at the negative input terminal (voltage $V_1$ at the node $N_1$) becomes equal to predetermined voltage $V_C$. In the same manner, the amplifier circuit $A_2$ forms the feedback circuit together with the transistor $M_2$ and the resistor $R_2$, and executes the feedback control such that voltage at the positive terminal and negative terminal in the amplifier circuit $A_2$ become equal. More specifically, the amplifier circuit $A_2$ controls the voltage at the gate terminal of the transistor $M_2$ such that the voltage at the negative input terminal (voltage $V_2$ at the node $N_2$) becomes equal to predetermined voltage $V_C$. With this configuration, the voltage $V_1$ and $V_2$ at the nodes $N_1$ and $N_2$ are controlled to be equal to the voltage $V_C$ applied to the positive input terminals in the respective amplifier circuits $A_1$ and $A_2$.

Meanwhile, the current consumed in the operation of the amplifier circuits $A_1$ and $A_2$ is smaller than the bias current received in the current amplifier circuit. Therefore, in the current amplifier circuit according to the present working example, the ratio between the bias current and the signal current can be improved, compared to the current amplifier circuit in the related art.

(Second Working Example)

Figure 3:
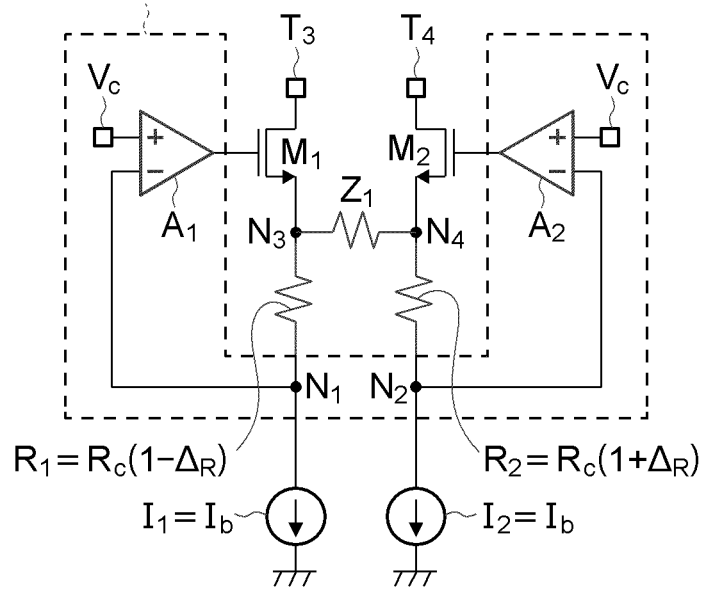

FIG. 3 is a diagram illustrating a second working example according to the present embodiment. According to the present working example, the resistors $R_1$ and $R_2$ are the sensor devices that change the resistance values in the opposite sides, centering a predetermined resistance value $R_C$ ($R_1=R_C(1-\Delta_R)$, and $R_2=R_C(1+\Delta_R)$). Further, the control circuit is connected to the current sources $I_1$ and $I_2$ at the nodes $N_1$ and $N_2$, and receives the bias current ($I_1=I_b$ and $I_2=I_b$). The configurations of other components are same as the first working example. In other words, according to the present working example, the sensor devices are disposed inside the current amplifier circuit and the input signals are generated inside the current amplifier circuit.

According to the present working example, when the current $I_1$ and current $I_2$ flow in the resistor $R_1$ and $R_2$, the voltage at the node $N_3$ becomes: $V_3=V_C+I_bR_C(1-\Delta_R)$. The voltage at the node $N_4$ becomes: $V_4=V_C+I_bR_C(1+\Delta_R)$. Therefore, the current $I_{Z1}$ flowing in the passive element $Z_1$ becomes: $I_{Z1}=-2I_bR_C\Delta_R/Z_1$. Due to this, the current $I_{M1}$ flowing in the transistor $M_1$ becomes: $I_{M1}=I_b-2R_CI_b\Delta_R/Z_1$. The current $I_{M2}$ flowing in the transistor $M_2$ becomes: $I_{M2}=I_b+2R_CI_b\Delta_R/Z_1$.

With this configuration, the bias current $I_B$ in the entire current amplifier circuit becomes: $I_B=2I_b$. And, the signal current $I_{SIG}$ to be output becomes: $I_{SIG}=4I_bR_C\Delta_R/Z_1$. In other words, according to the present working example, the signal current can be amplified without amplifying the bias current in the current amplifier circuit as described above. Therefore, the ratio between the bias current and the signal current can be improved, compared to the current amplifier circuit in the related art.

Meanwhile, either the resistor $R_1$ or $R_2$ may be the fixed resistor having the resistance value $R_C$. In this case, the signal current is generated at only one of the resistors $R_1$ and $R_2$, and the bias current $I_B$ becomes: $I_B=2I_b$. And, the signal current $I_{SIG}$ becomes: $I_{SIG}=-2I_bR_C\Delta_R/Z_1$.

(Third Working Example)

Figure 4:
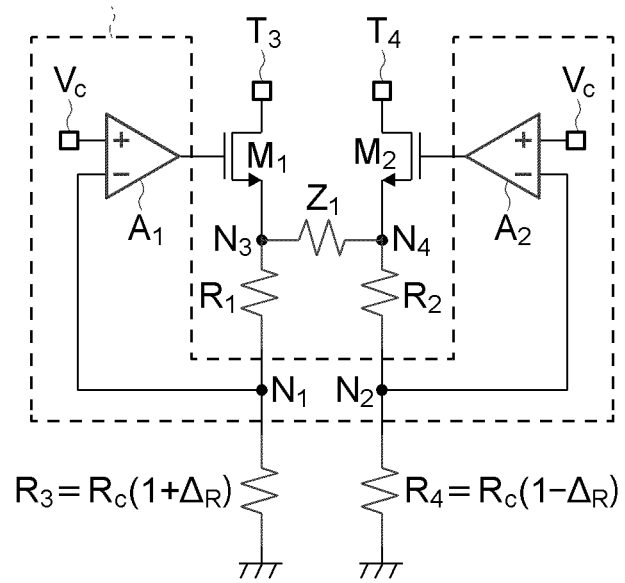

FIG. 4 is a diagram illustrating a third working example according to the present embodiment. The present working example is a modified example of the first working example, and the current amplifier circuit includes resistors $R_3$ and $R_4$ instead of the current sources $I_1$ and $I_2$ of the first embodiment. The resistor $R_3$ and $R_4$ are the sensor devices that change the resistance values in the opposite direction, centering the predetermined resistance value $R_C$ ($R_3=R_C(1+\Delta_R)$, $R_4=R_C(1-\Delta_R)$) and the resistor $R_3$ and $R_4$ are respectively connected at the node $N_1$ and $N_2$ respectively. According to the present working example, the current $I_1$ and $I_2$ generated at the resistor $R_3$ and $R_4$ are to be the input signals.

According to the present working example, the voltage at the nodes $N_1$ and $N_2$ is controlled at the predetermined voltage $V_C$, and therefore the current $I_1$ flowing in the resistor $R_3$ is: $I_1=V_C/\{R_C(1+\Delta_R)\}$, and the current $I_2$ flowing in the resistor $R_4$ is $I_2=V_C/\{R_C(1-\Delta_R)\}$. In the case of $1>>\Delta_R$, the current $I_1$ and $I_2$ can be approximated as follows: $I_1\approx V_C/R_C-V_C\Delta_R/R_C$, $I_2\approx V_C/R_C+V_C\Delta_R/R_C$. More specifically, the current amplifier circuit according to the present working example differentially receives, from the nodes $N_1$ and $N_2$, the input signal on which the signal current ($V_C\Delta_R/R_C$) is superimposed on the bias current ($V_C/R_C$). Therefore, the current amplifier circuit according to the present working example operates in the same manner as the first working example, and the ratio between the bias current and the signal current can be improved, compared to the current amplifier circuit in the related art.

(Fourth Working Example)

Figure 5:
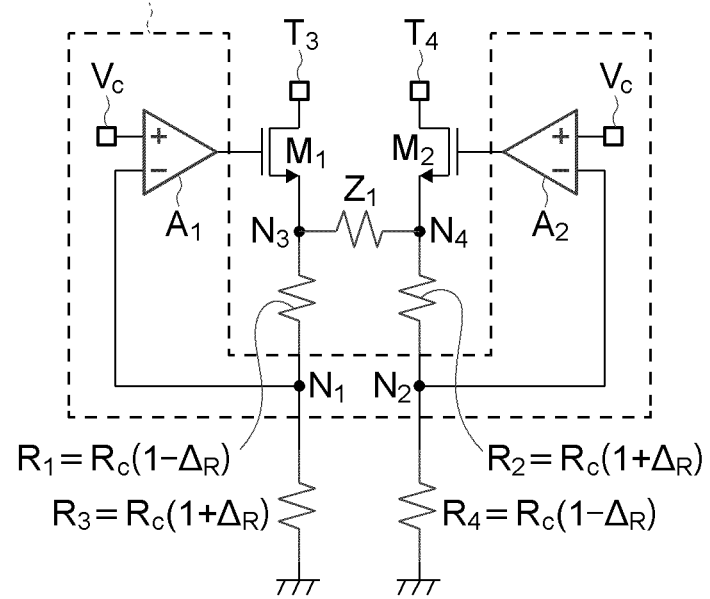

FIG. 5 is a diagram illustrating a fourth working example according to the present embodiment. The current amplifier circuit according to the present working example is formed by combining the current amplifier circuit of the second working example with that of the third working example, and all of the resistors $R_1$ to $R_4$ are sensor devices. The resistor $R_1$ has opposite polarity of resistance value change with respect to the resistor $R_2$, and the resistor $R_3$ has the opposite polarity of the resistance value change with respect to the resistor $R_4$. More specifically, the resistors are: $R_1=R_4=R_C(1-\Delta_R)$, and $R_2=R_3=R_C(1+\Delta_R)$.

In this case, as described in the third working example, the input signal is: $I_1\approx V_C/R_C-V_C\Delta_R/R_C$, and $I_2\approx V_C/R_C+V_C\Delta_R/R_C$. Therefore, the voltage $V_3$ at the node $N_3$ can be approximated as next: $V_3\approx V_C+I_1R_1=2V_C-2V_C\Delta_R+V_C(\Delta_R)^2\approx 2V_C-2V_C\Delta_R$. Further, the voltage $V_4$ at the node $N_4$ can be approximated as next: $V_4\approx V_C+I_2R_2=2V_C+2V_C\Delta_R+V_C(\Delta_R)^2\approx 2V_C+2V_C\Delta_R$. Therefore, the current $I_{Z1}$ flowing in the passive element $Z_1$ becomes: $I_{Z1}\approx 4V_C\Delta_R/Z_1$. Here, provided that the bias current $I_b=V_C/R_C$ and the signal current contained in the input signal is $I_1-I_2=2V_C\Delta_R/R_C$, the bias current and the signal current become as next: $I_B=2I_b$, and $I_{SIG}=2V_C\Delta_R/R_C+8V_C\Delta_R/Z_1$. In other words, according to the present working example, the signal current is further amplified and amplification of the bias current is suppressed. Therefore, the ratio between the bias current and the signal current can be improved, compared to the current amplifier circuit in the related art.

(Fifth Working Example)

Figure 6:
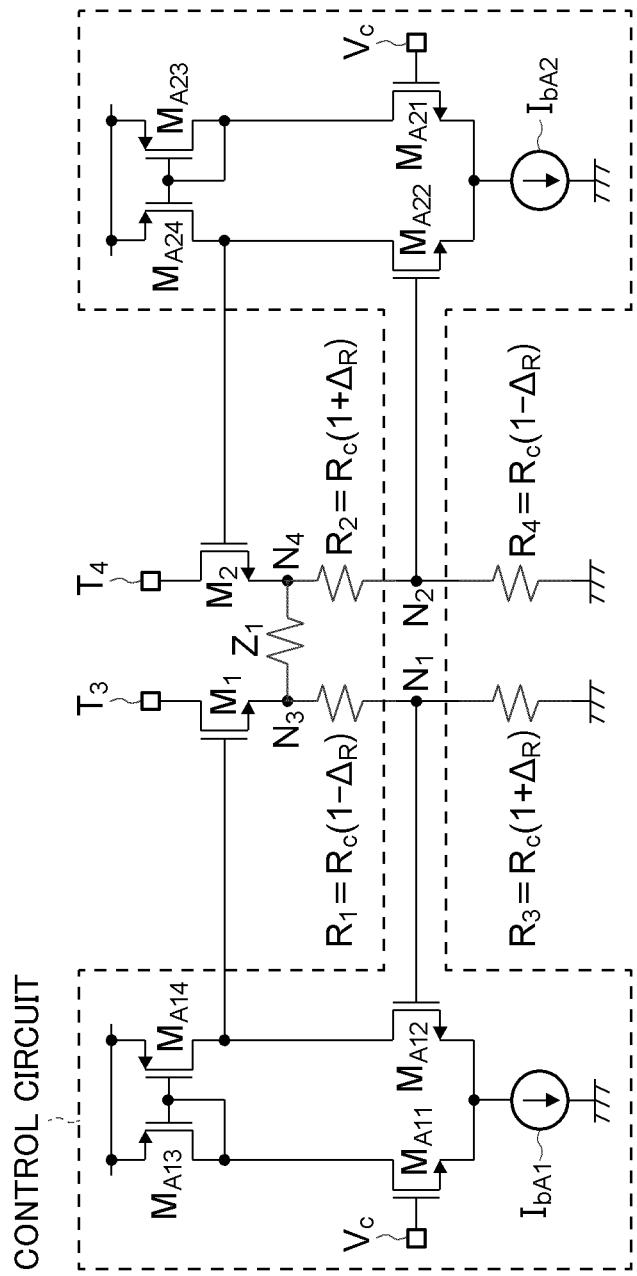

FIG. 6 is a diagram illustrating a fifth working example according to the present embodiment. The present working example is a concrete example of the fourth working example, in which each of the amplifier circuits $A_1$ and $A_2$ according to the fourth working example are formed of an amplifier circuit including a plurality of transistors.

The amplifier circuit $A_1$ ($A_2$) includes a transistor $M_{A11}$ ($M_{A21}$), a transistor $M_{A12}$ ($M_{A22}$), a transistor $M_{A13}$ ($M_{A23}$), a transistor $M_{A14}$ ($M_{A24}$), and a current source $I_{bA1}$ ($I_{bA2}$). The transistors $M_{A11}$, $M_{A12}$, $M_{A21}$, and $M_{A22}$ are NMOS transistors, and the transistors $M_{A13}$, $M_{A14}$, $M_{A23}$, and $M_{A24}$ are PMOS transistors.

The transistor $M_{A11}$ ($M_{A21}$) has a gate terminal from which the predetermined bias voltage $V_C$ is received, and a source terminal connected to the current source $I_{bA1}$ ($I_{bA2}$). The transistor $M_{A12}$ ($M_{A22}$) has a gate terminal connected to the node $N_1$ ($N_2$), and a source terminal connected to the current source $I_{bA1}$ ($I_{bA2}$). The transistor $M_{A13}$ ($M_{A23}$) and the transistor $M_{A14}$ ($M_{A24}$) form the current mirror circuit, and the transistor $M_{A14}$ ($M_{A24}$) has a drain terminal connected the gate terminal of the transistor $M_1$ ($M_2$).

With this configuration, when the voltage $V_1$ ($V_2$) at the node $N_1$ ($N_2$) becomes higher than the bias voltage $V_C$, the drain current at the transistor $M_{A11}$ ($M_{A21}$) is decreased and the drain current is copied at the current mirror circuit. Then, the output of the amplifier circuit $A_1$ ($A_2$) is decreased, i.e., the voltage at the gate terminal of the transistor $M_1$ ($M_2$) is decreased and the voltage $V_1$ ($V_2$) is decreased. In the same manner, when the voltage $V_1$ ($V_2$) at the node $N_1$ ($N_2$) becomes lower than the bias voltage $V_C$, the drain current at the transistor $M_{A11}$ ($M_{A21}$) is increased and the drain current is copied at the current mirror circuit. Then, the output of the amplifier circuit $A_1$ ($A_2$) is increased, i.e., the voltage at the gate terminal of the transistor $M_1$ ($M_2$) is increased and the voltage $V_1$ ($V_2$) is increased. Therefore, the voltage at the gate terminal of the transistor $M_1$ ($M_2$) is controlled by the amplifier circuit $A_1$ ($A_2$) such that the voltage $V_1$ ($V_2$) at the node $N_1$ ($N_2$) becomes equal to the bias voltage $V_C$.

(Sixth Working Example)

Figure 7:
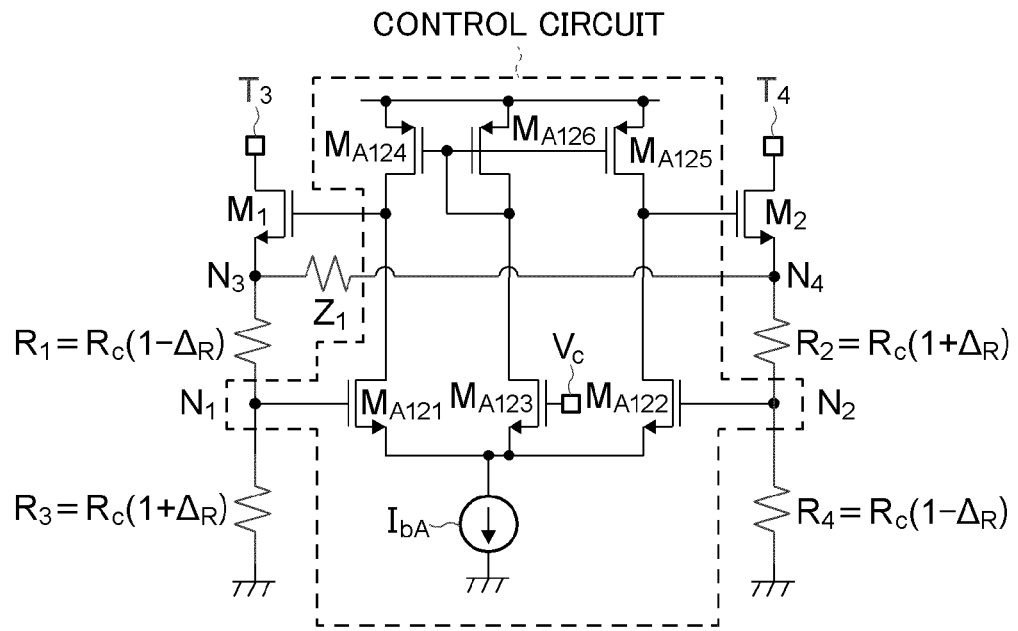

FIG. 7 is a diagram illustrating a sixth working example according to the present embodiment. The present working example is a modified example of the fifth working example, in which the amplifier circuits $A_1$ and $A_2$ of the fifth working example are formed of a single amplifier circuit. In other words, according to the present working example, the control circuit is formed of the single amplifier circuit.

The control circuit includes transistors $M_{A121}$, $M_{A122}$, and $M_{A123}$ each having a source terminal connected to the current source $I_{bA}$, and transistors $M_{A124}$, $M_{A125}$, and $M_{A126}$ forming the current mirror circuit. The transistors $M_{A121}$, $M_{A122}$, and $M_{A123}$ are NMOS transistors, and the transistors $M_{A124}$, $M_{A125}$, and $M_{A126}$ are PMOS transistors.

The transistor $M_{A123}$ has a gate terminal from which the bias voltage $V_C$ is applied. The transistor $M_{A121}$ has a gate terminal connected to the node $N_1$, and the transistor $M_{A122}$ has a gate terminal connected to the node $N_2$. Further, transistor $M_{A121}$ has a drain terminal connected to the gate terminal of the transistor $M_1$, and the transistor $M_{A122}$ has a drain terminal connected to the gate terminal of the transistor $M_2$.

The operation of the amplifier circuit $A_1$ according to the fifth working example is implemented by the amplifier circuit including the transistors $M_{A121}$, $M_{A123}$, $M_{A124}$, and $M_{A126}$, and the operation of the amplifier circuit $A_2$ is implemented by the amplifier circuit including the transistors $M_{A122}$, $M_{A123}$, $M_{A125}$, and $M_{A126}$. In the control circuit according to the present working example, noise generated from the transistors $M_{A123}$, $M_{A126}$, and the current source $I_{bA}$ is superimposed on a common-mode output signal and is not superimposed on a differential output signal. Therefore, the current amplifier circuit having low noise can be achieved. Additionally, since the control circuit is configured of one single amplifier circuit, thereby achieving to reduce the current consumed at the control circuit.

(Seventh Working Example)

Figure 8:
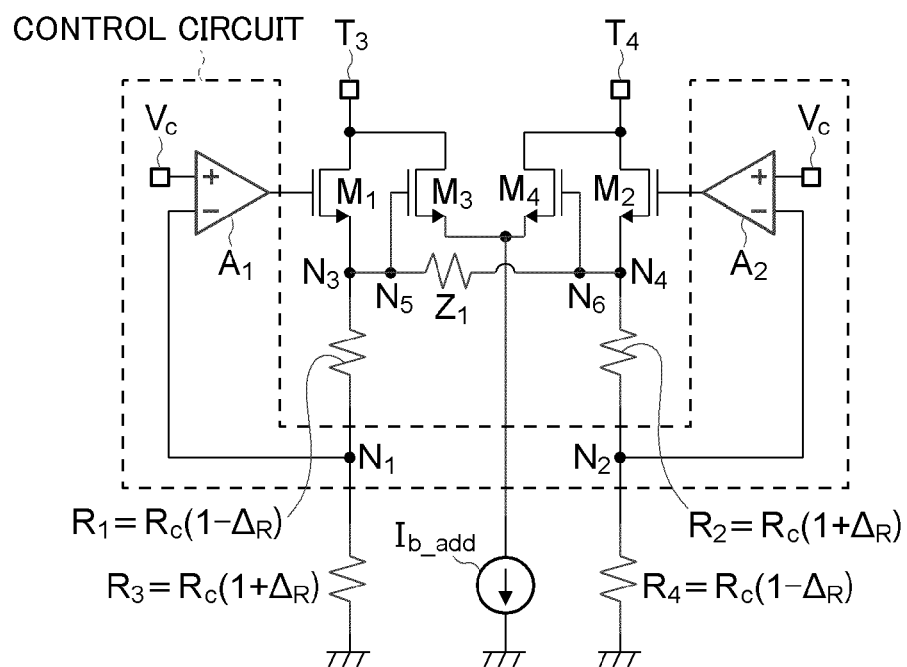

FIG. 8 is a diagram illustrating a seventh working example according to the present embodiment. The present working example is a modified example of the fourth working example, and further includes the transistors $M_3$, $M_4$ and a current source $I_{b\_add}$. The transistor $M_3$ ($M_4$) is an NMOS transistor, having a gate terminal connected to the source terminal of the transistor $M_1$ ($M_2$) at a node $N_5$ ($N_6$), a source terminal connected to the current source $I_{b\_add}$, and a drain terminal connected to the output terminal $T_3$ ($T_4$).

With this configuration, the voltage $V_3$ at the node $N_3$ is applied to the gate terminal of the transistor $M_3$, and the voltage $V_4$ at the node $N_4$ is applied to the gate terminal of the transistor $M_4$. Therefore, when the voltage $V_3$ ($V_4$) becomes higher than voltage $V_4$ ($V_3$) due to the signal current, the drain current at the transistor $M_3$ ($M_4$) is increased and the drain current at the transistor $M_4$ ($M_3$) is decreased. Due to this, the signal current can be further amplified because it is possible to generate an output signal in which the drain current of the transistor $M_3$ ($M_4$) having been increased (decreased) corresponding to the signal current is added to the drain current of the transistor $M_1$ ($M_2$).

(Eighth Working Example)

Figure 9:
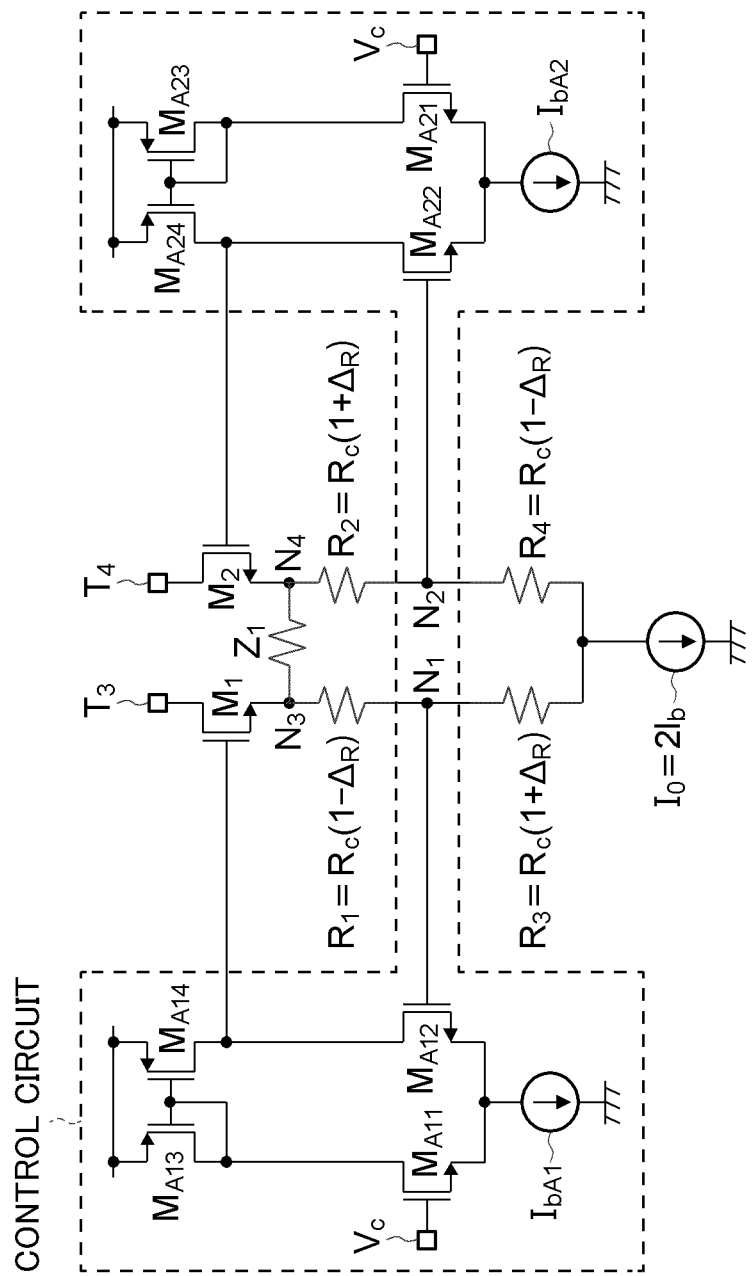

FIG. 9 is a diagram illustrating an eighth working example according to the present embodiment. The present working example is a modified example of the fifth working example, and the resistors $R_3$ and $R_4$ are connected to the current source $I_0$. With this configuration, the input signals (current $I_1$ and $I_2$) generated at the resistor $R_3$ and $R_4$ can be set without depending on manufacturing variation of the resistors $R_3$ and $R_4$ or the bias voltage $V_C$. For example, in the case where the current $I_o$ to be input from the current source $I_0$ has a current value $2I_b$, the current $I_1$ and $I_2$ become: $I_1=I_b(1-\Delta_R)$, and $I_2=I_b(1+\Delta_R)$.

(Ninth Working Example)

Figure 10:
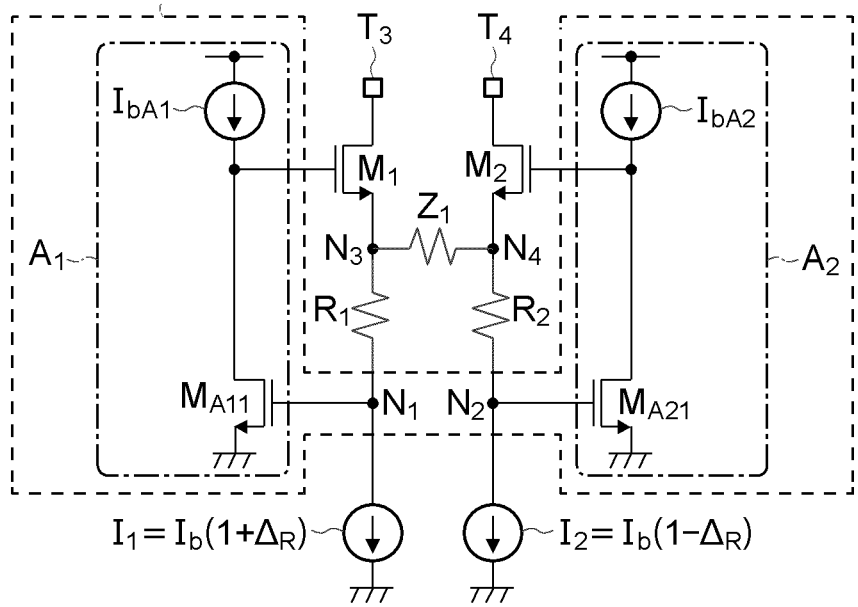

FIG. 10 is a diagram illustrating a ninth working example according to the present embodiment. The present working example is a modified example of the first working example, and the control circuit includes an inverting amplifier circuit $A_1$ ($A_2$) formed of a transistor $M_{A11}$ ($M_{A21}$) and a current source $I_{bA1}$ ($I_{bA2}$). The transistor $M_{A11}$ ($M_{A21}$) is an NMOS transistor, having a source terminal grounded, a gate terminal connected to the node $N_1$ ($N_2$), and a drain terminal connected to the current source $I_{bA1}$ ($I_{bA2}$) and to the gate terminal of the transistor $M_1$ ($M_2$).

With this configuration, the voltage at the gate terminal of the transistor $M_1$ ($M_2$) is controlled such that the voltage at the gate terminal of the transistor $M_{A11}$ ($M_{A21}$), namely, the voltage $V_1$ ($V_2$) at the node $N_1$ ($N_2$) becomes the gate-source voltage $V_{GS\_MA11}$ ($V_{GS\_MA21}$) of the transistor $M_{A11}$ ($M_{A21}$) determined in accordance with current at the current source $I_{bA1}$ ($I_{bA2}$). Therefore, the voltage $V_1$ ($V_2$) can be equal to the gate-source voltage $V_{GS\_MA11}$ ($V_{GS\_MA21}$) by equalizing the device size of the transistors $M_{A11}$ and $M_{A21}$ or the current values at the current sources $I_{bA1}$ and $I_{bA2}$. According to the present working example, the number of components in the control circuit can be reduced and the voltage $V_1$ ($V_2$) at the nodes $N_1$ and $N_2$ can be equalized with a more simple circuit.

(Tenth Working Example)

Figure 11:
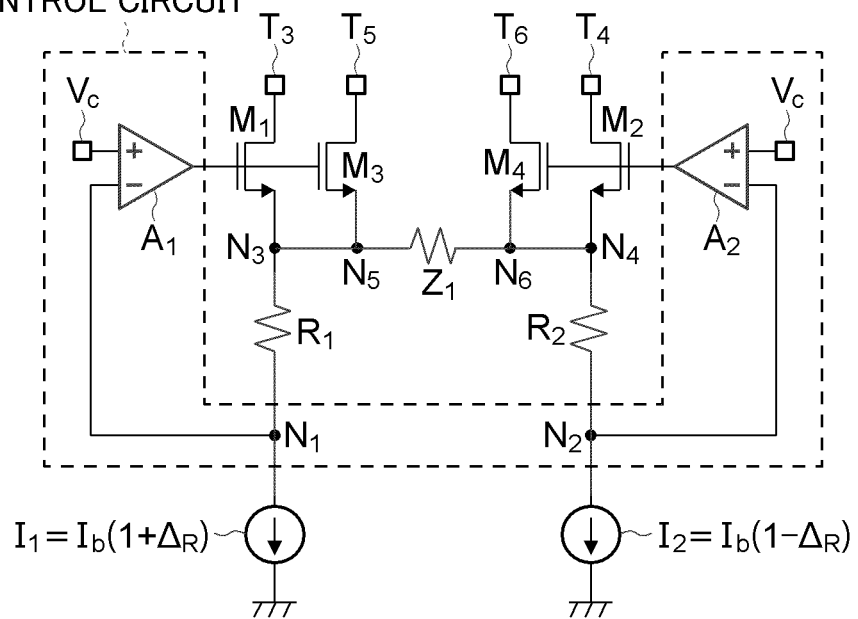

FIG. 11 is a diagram illustrating a tenth working example according to the present embodiment. The present working example is a modified example of the first working example, and further includes transistors $M_3$ and $M_4$ and output terminals $T_5$ and $T_6$. The transistor $M_3$ ($M_4$) is an NMOS transistor, having a drain terminal connected to the output terminal $T_5$ ($T_6$), a source terminal connected to the source terminal of the transistor $M_1$ ($M_2$) at the node $N_5$ ($N_6$), and a gate terminal connected to the control circuit. The voltage at the gate terminal of the transistor $M_3$ ($M_4$) is controlled by the control circuit.

With this configuration, the number of output terminals is increased and the larger number of multiple output signals can be output. A current value of the output signal output from each of the output terminals is determined by the device size ratio of each of the transistors. Note that the number of the transistors and the output terminals to be increased may be optionally selected, for example, same on the right side and left side of the passive element $Z_1$ or may be different in each side.

(Eleventh Working Example)

Figure 12:
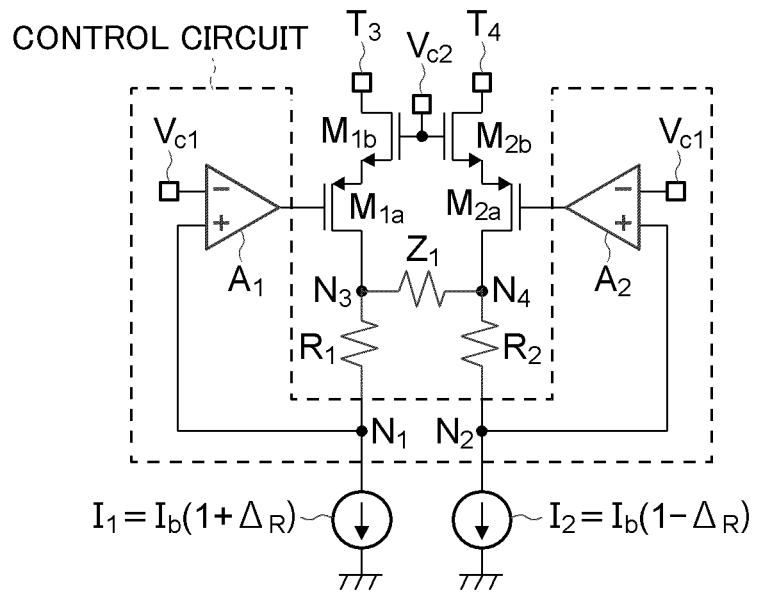

FIG. 12 is a diagram illustrating an eleventh working example according to the present embodiment. The present working example is a modified example of the first working example, and includes transistors $M_{1a}$ ($M_{2a}$) and $M_{1b}$ ($M_{2b}$) instead of the transistor $M_1$ ($M_2$). The amplifier circuit $A_1$ ($A_2$) forming the control circuit has the negative input terminal from which the bias voltage $V_{C1}$ is applied, and has the positive input terminal connected to the node $N_1$ ($N_2$). The transistor $M_{1a}$ ($M_{2a}$) is a PMOS transistor, having a drain terminal connected to the resistor $R_1$ ($R_2$) and to the passive element $Z_1$ at the node $N_3$ ($N_4$), a gate terminal connected to the control circuit, and a source terminal connected to a source terminal of the transistor $M_{1b}$ ($M_{2b}$). The transistor $M_{1b}$ ($M_{2b}$) is an NMOS transistor, having the source terminal connected to the source terminal of the transistor $M_{1a}$ ($M_{2a}$), a gate terminal from which a predetermined bias voltage $V_{C2}$ is applied, and a drain terminal connected to the output terminal $T_3$ ($T_4$).

With this configuration, when the voltage at the gate terminal of the transistor $M_{1a}$ ($M_{2a}$) becomes high, the gate-source voltage at the transistor $M_{1a}$ ($M_{2a}$) and transistor $M_{1b}$ ($M_{2b}$) becomes low, thereby decreasing the current flowing in the transistor $M_{1a}$ ($M_{2a}$) and transistor $M_{1b}$ ($M_{2b}$). In other words, the polarity becomes opposite to the transistor $M_1$ ($M_2$) of the first working example. Therefore, the bias voltage $V_{C1}$ is received from the negative input terminal of the amplifier circuit $A_1$ ($A_2$) and the positive input terminal is connected to the node $N_1$ ($N_2$), thereby forming a feedback circuit and achieving to control the voltage $V_1$ ($V_2$) at the node $N_1$ ($N_2$) to be the bias voltage $V_{C1}$.

Further, according to the first working example, a gain from the gate terminal to the source terminal in the transistor $M_1$ ($M_2$) is substantially one; however, the gain from the gate terminal to the drain terminal in the transistor $M_{1a}$ ($M_{2a}$) can be set at one or larger according to the present working example. Due to this, it is possible to make an open loop gain large and make a voltage difference between the positive input terminal and the negative input terminal of the amplifier circuit $A_1$ ($A_2$) small. Therefore, the control circuit according to the present working example is capable of accurately controlling the voltage at the gate terminal of the transistor $M_{1a}$ ($M_{2a}$).

(Twelfth Working Example)

Figure 13:
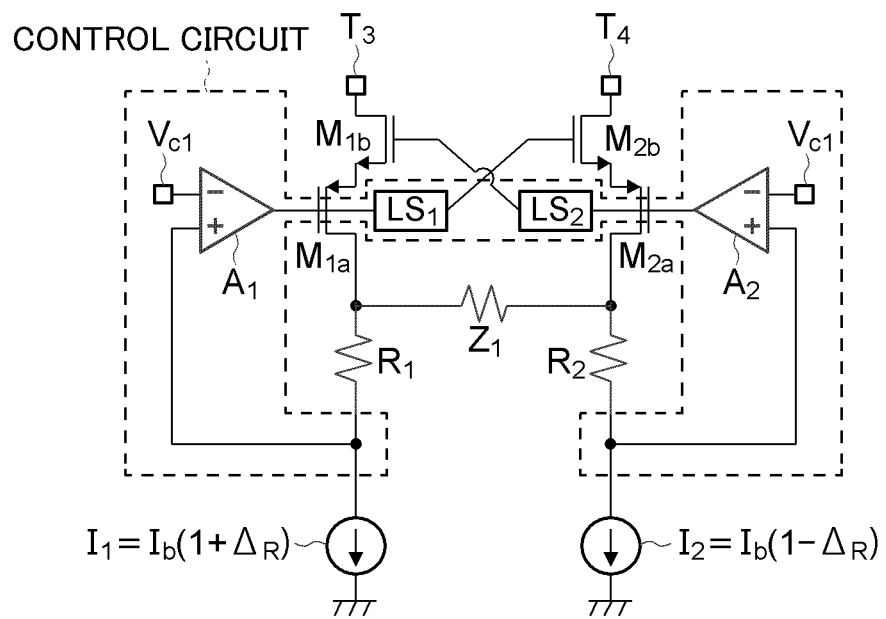

FIG. 13 is a diagram illustrating a twelfth working example according to the present embodiment. The present working example is a modified example of the eleventh working example, and further includes level shift circuits $LS_1$ and $LS_2$. The level shift circuit $LS_1$ ($LS_2$) is connected to the control circuit, the gate terminal of the transistor $M_{1a}$ ($M_{2a}$) and the gate terminal of the transistor $M_{2b}$ ($M_{1b}$). The level shift circuit $LS_1$ ($LS_2$) converts the output voltage of the amplifier circuit $A_1$ ($A_2$) so as to match an operating point of the transistor $M_{2b}$ ($M_{1b}$), and applies the converted voltage to the gate terminal of the transistor $M_{2b}$ ($M_{1b}$).

With this configuration, when the output voltage of the amplifier circuit $A_1$ ($A_2$), namely, the voltage at the gate terminal of the transistor $M_{1a}$ ($M_{2a}$) becomes high, operation is executed such that the voltage at the gate terminal of the transistor $M_{1b}$ ($M_{2b}$) becomes low. Due to this, the drain current at the transistor $M_{1a}$ ($M_{2b}$) is further decreased, compared to the twelfth working example. Therefore, it is possible to make the gain from the gate terminal to the drain terminal at the transistor $M_{1a}$ ($M_{2a}$) large and make the voltage difference between the positive input terminal and the negative input terminal at the amplifier circuit $A_1$ ($A_2$) small. As a result, the voltage at the gate terminal of the transistor $M_{1a}$ ($M_{2a}$) can be accurately controlled.

(Thirteenth Working Example)

Figure 14:
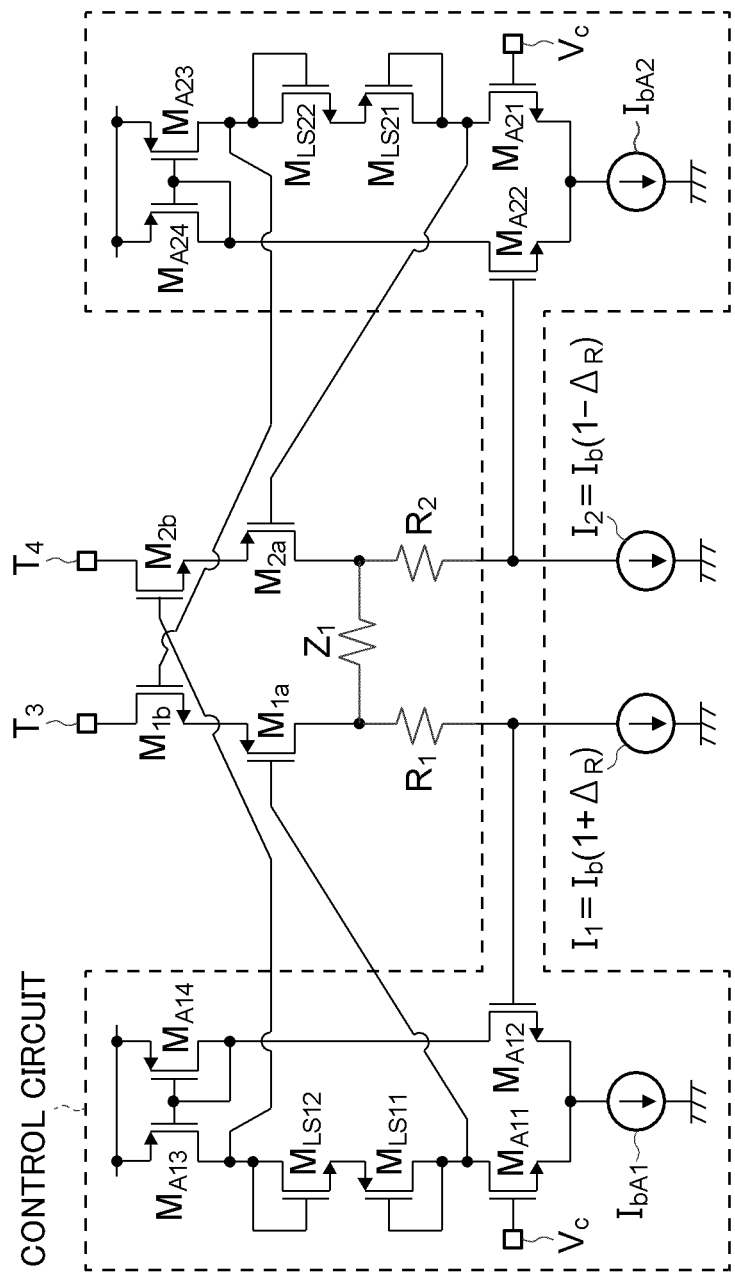

FIG. 14 is a diagram illustrating a thirteenth working example according to the present embodiment. The present working example is a concrete example of the twelfth working example, in which the level shift circuits $LS_1$ and $LS_2$ are formed of a plurality of the transistors inside the control circuit. The configuration of the control circuit is same as the eighth working example.

The level shift circuit $LS_1$ ($LS_2$) includes a transistor $M_{LS11}$ ($M_{LS21}$) and a transistor $M_{LS12}$ ($M_{LS22}$). The transistor $M_{LS11}$ ($M_{LS21}$) is a PMOS transistor, having a drain terminal connected to the gate terminal of the transistor $M_{1a}$ ($M_{2a}$) and to the drain terminal of the transistor $M_{A11}$ ($M_{A21}$), a gate terminal diode-connected to the drain terminal, and a source terminal connected to a source terminal of the transistor $M_{LS12}$ ($M_{LS22}$). The transistor $M_{LS12}$ ($M_{LS22}$) is an NMOS transistor, having the source terminal connected to the source terminal of the transistor $M_{LS11}$ ($M_{LS21}$), a drain terminal connected to the gate terminal of the transistor $M_{2b}$ ($M_{1b}$) and to the drain terminal of the transistor $M_{A13}$ ($M_{A23}$), and a gate terminal diode-connected to the drain terminal. Thus, the bias current between the level shift circuit $LS_1$ ($LS_2$) and the amplifier circuit $A_1$ ($A_2$) can be shared by disposing the level shift circuit $LS_1$ ($LS_2$) inside the control circuit (amplifier circuits $A_1$ and $A_2$). Therefore, increase of the bias current in the entire current amplifier circuit can be suppressed.

(Fourteenth Working Example)

Figure 15:
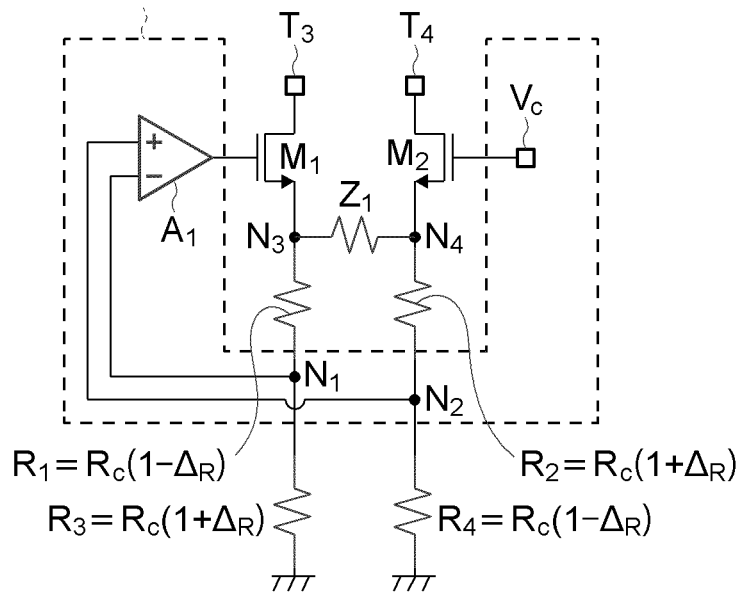

FIG. 15 is a diagram illustrating a fourteenth working example according to the present embodiment. The present working example is a modified example of the fourth working example, in which the control circuit is formed of a single amplifier circuit $A_1$. The amplifier circuit $A_1$ has the negative input terminal connected to the resistor $R_1$ at the node $N_1$, and the positive input terminal connected to the resistor $R_2$ at the node $N_2$. Further, the transistor $M_2$ has the gate terminal from which the bias voltage $V_C$ is applied. The amplifier circuit $A_1$ compares the voltage $V_1$ at the node $N_1$ with the voltage $V_2$ at the node $N_2$, and controls the voltage at the gate terminal of the transistor $M_1$ such that the voltage $V_1$ and $V_2$ become equal to a predetermined voltage set by the bias voltage $V_C$. With this configuration, the number of components in the control circuit can be reduced.

(Fifteenth Working Example)

Figure 16:
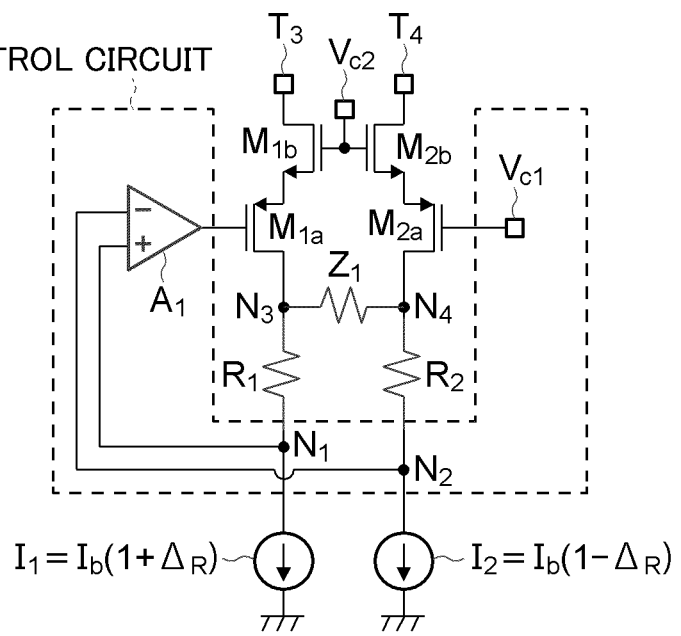

FIG. 16 is a diagram illustrating a fifteenth working example of the present embodiment. The present working example is a modified example of the eleventh working example, in which the control circuit is formed of the single amplifier circuit $A_1$, same as the fourteenth working example. In this case, the polarity of the transistor $M_{1a}$ is opposite to the polarity of the transistor $M_1$ of the fourteenth working example. Therefore, the amplifier circuit $A_1$ has the positive input terminal connected to the resistor $R_1$ at the node $N_1$, and the negative input terminal connected to the resistor $R_2$ at the node $N_2$. With this configuration, the number of components in the control circuit can be reduced.

(Sixteenth Working Example)

Figure 17:
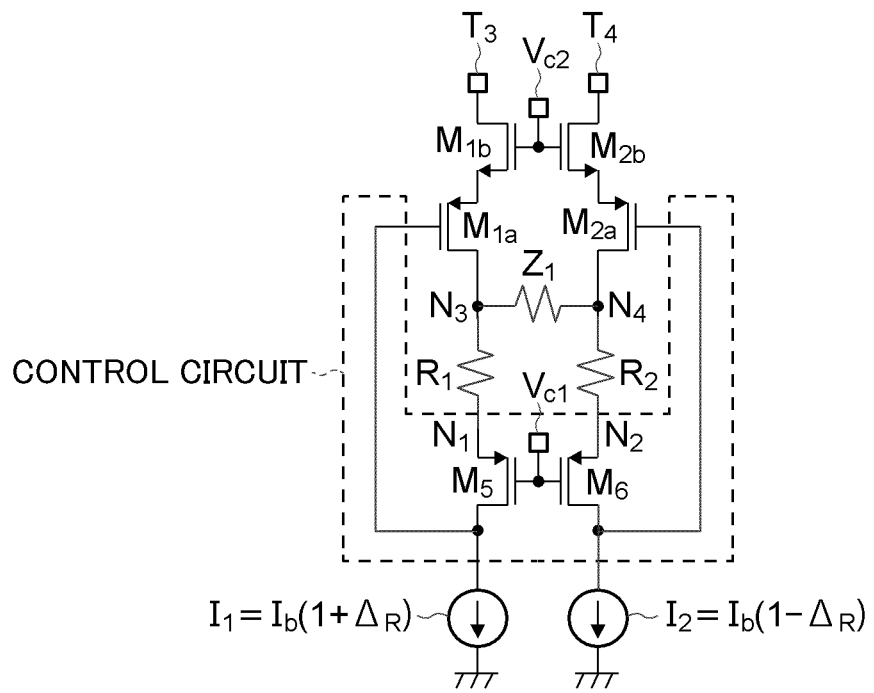

FIG. 17 is a diagram illustrating a sixteenth working example of the present embodiment. The present working example is a modified example of the eleventh working example, in which the control circuit is formed of a common-gate circuit including transistors $M_5$ and $M_6$. The transistor $M_5$ ($M_6$) is a PMOS transistor, having a gate terminal from which the bias voltage $V_{C1}$ is applied, a source terminal connected to the resistor $R_1$ ($R_2$) at the node $N_1$ ($N_2$), and a drain terminal connected to the gate terminal of the transistor $M_{1a}$ ($M_{2a}$) and the current sources $I_1$ and $I_2$.

With this configuration, the input signals received from the current sources $I_1$ and $I_2$ are applied to the resistors $R_1$ and $R_2$ via the transistors $M_5$ and $M_6$. Further, the voltage at the source terminals of the transistors $M_5$ and $M_6$, namely, the voltage $V_1$ and $V_2$ at the nodes $N_1$ and $N_2$ become substantially equal in the case of $\Delta_R \ll 1$, because the respective current are: $I_1 = I_b(1+\Delta_R)$ and $I_2 = I_b(1-\Delta_R)$. With this configuration, the amplifier circuit is not used as the control circuit, and therefore increase of the bias current can be suppressed.

(Second Embodiment)

Figure 18:
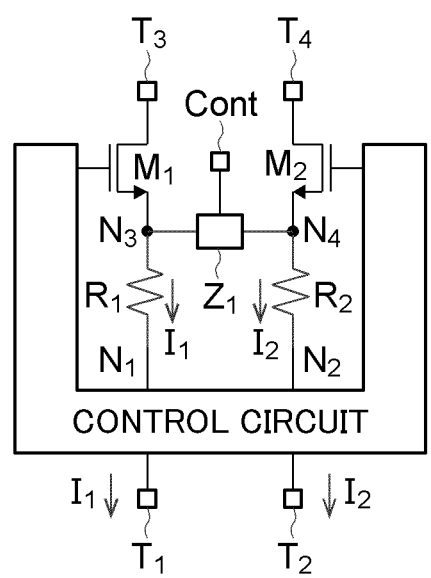
FIG. 18 is a diagram of a current amplifier circuit according to a second embodiment.

Next, a current amplifier circuit according to a second embodiment will be described with reference to FIGS. 18 to 20. Here, FIG. 18 is a diagram illustrating the current amplifier circuit according to the second embodiment. As illustrated in FIG. 18, the current amplifier circuit according to the present embodiment includes a transistor $M_1$, a resistor $R_1$, a transistor $M_2$, a resistor $R_2$, a passive element $Z_1$, and a control circuit, and impedance element $Z_1$ of the passive element $Z_1$ is controlled by the control signal Cont. The configurations of other components are same as the first embodiment.

Figure 19:
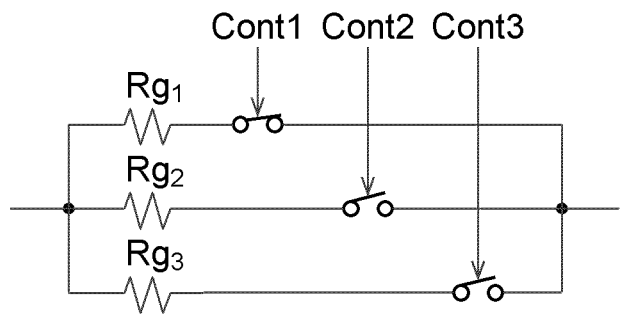
FIG. 19 is a diagram illustrating an example of a passive element in FIG. 18.

The passive element $Z_1$ according to the present embodiment may be formed of, for example, a plurality of resistors $Rg_1$ to $Rg_3$ connected in parallel and switches connected to the respective resistors in series, as illustrated in FIG. 19. The impedance element $Z_1$ (resistance value in this case) can be changed by controlling opening and closing of the respective switches by the control signal Cont. Additionally, there are other possible configurations in which a plurality of capacitor is connected in parallel instead of the resistors or the resistor and the capacitor are combined.

Figure 20:
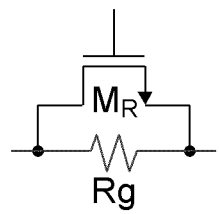
FIG. 20 is a diagram illustrating another example of the passive element in FIG. 18.

Also, as illustrated in FIG. 20, the passive element $Z_1$ may be configured by connecting a transistor $M_R$ and a resistor Rg in parallel. By controlling voltage at a gate terminal of the transistor $M_R$ with the control signal Cont, the passive element $Z_1$ can be variable resistor and the impedance element $Z_1$ can be controlled.

As described in the first embodiment, a signal current $I_{SIG}$ is determined by the impedance element $Z_1$. Therefore, in the current amplifier circuit according to the present embodiment, an amplification factor of the signal current can be controlled by controlling the impedance element $Z_1$ of the passive element $Z_1$ by the control signal Cont.

(Third Embodiment)

Figure 21:
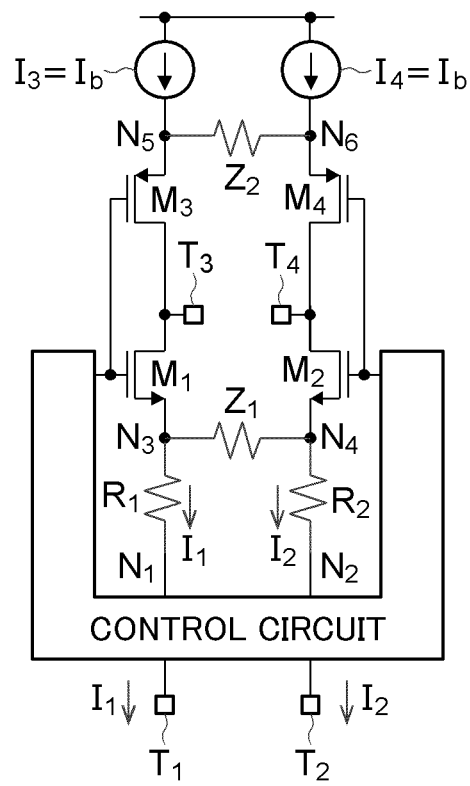
FIG. 21 is a diagram illustrating a current amplifier circuit according to a third embodiment.

Next, a current amplifier circuit according to a third embodiment will be described with reference to FIG. 21. Here, FIG. 21 is a diagram illustrating the current amplifier circuit according to the third embodiment. As illustrated in FIG. 21, the current amplifier circuit according to the present embodiment includes a transistor $M_1$, a resistor $R_1$, a transistor $M_2$, a resistor $R_2$, a passive element $Z_1$, and a control circuit. The configurations of the above components are same as the first embodiment. The current amplifier circuit according to the present embodiment further includes a transistor $M_3$, a transistor $M_4$, a passive element $Z_2$, and current sources $I_3$, $I_4$.

The transistor $M_3$ (third transistor) is a PMOS transistor, having a drain terminal (first terminal) connected to a drain terminal of the transistor $M_1$ and to an output terminal $T_3$, a gate terminal (control terminal) connected to a gate terminal of the transistor $M_1$ and to a control circuit, and a source terminal connected to the passive element $Z_2$ and to the current source $I_3$.

The transistor $M_4$ (fourth transistor) is the PMOS transistor, having a drain terminal (first terminal) connected to a drain terminal of the transistor $M_2$ and to an output terminal $T_4$, a gate terminal (control terminal) connected to a gate terminal of the transistor $M_2$ and to the control circuit, and a source terminal connected to the passive element $Z_2$ and to the current source $I_4$.

The passive element $Z_2$ (second passive element) is connected to a source terminal of the transistor $M_3$ and a source terminal of the transistor $M_4$. In the passive element $Z_2$, current $I_{Z2}$ flows. Note that the configuration of the passive element $Z_2$ is same as the passive element $Z_1$.

The current source $I_3$ is connected between the source terminal of the transistor $M_3$ and a power source and supplies bias current $I_b$ to the transistor $M_3$. The current source $I_4$ is connected between the source terminal of the transistor $M_4$ and the power source, and supplies the bias current $I_b$ to the transistor $M_4$.

Next, operation of the current amplifier circuit according to the present embodiment will be described. When current $I_1$ ($I_2$) received from an input terminal $T_1$ ($T_2$) becomes larger, the control circuit controls the voltage at the gate terminal of the transistor $M_1$ ($M_2$) such that drain current $I_{M1}$ ($I_{M2}$) at the transistor $M_1$ ($M_2$) becomes large. As a result, the voltage at the gate terminal of the transistor $M_1$ ($M_2$) becomes high. In this instance, voltage at the gate terminal of the transistor $M_3$ ($M_4$) also becomes high because the gate terminal of the transistor $M_3$ ($M_4$) is connected to the control circuit. Since the transistor $M_3$ ($M_4$) is the PMOS transistor, the drain current $I_{M3}$ ($I_{M4}$) becomes small when the voltage at the gate terminal becomes high.

In the same manner, when the current $I_1$ ($I_2$) received from the input terminal $T_1$ ($T_2$) becomes small, the control circuit controls the voltage at the gate terminal of the transistor $M_1$ ($M_2$) such that drain current $I_{M1}$ ($I_{M2}$) flowing in the transistor $M_1$ ($M_2$) becomes small. Therefore, the voltage at the gate terminal of the transistor $M_1$ ($M_2$) becomes low. Due to this, the voltage at the gate terminal of the transistor $M_3$ ($M_4$) also becomes low and the drain current $I_{M3}$ ($I_{M4}$) becomes large. Thus, the transistor $M_3$ ($M_4$) complementarily operates with respect to the transistor $M_1$ ($M_2$).

Therefore, when the current $I_1$ and $I_2$ are received from the input terminals $T_1$ and $T_2$, a difference between the current $I_1$ and current $I_2$, namely, the current $I_{Z2}$ corresponding to $\Delta_R$ flows in the passive element $Z_2$, and the drain current in the transistors $M_3$ and $M_4$ become: $I_{M3}=I_b+I_{Z2}$, and $I_{M4}=I_b-I_{Z2}$.

Due to this, the signal current $I_{SIG}$ contained in the output signal output from the output terminals $T_3$ and $T_4$ becomes a sum of $I_{M1}-I_{M2}$ and $I_{M3}-I_{M4}$.

As described above, in the current amplifier circuit according to the present embodiment, the signal current can be amplified larger than in the current amplifier circuit according to the first embodiment. Therefore, compared to the current amplifier circuit in the related art, the ratio between the bias current and the signal current can be improved.

(Fourth Embodiment)

Figure 22:
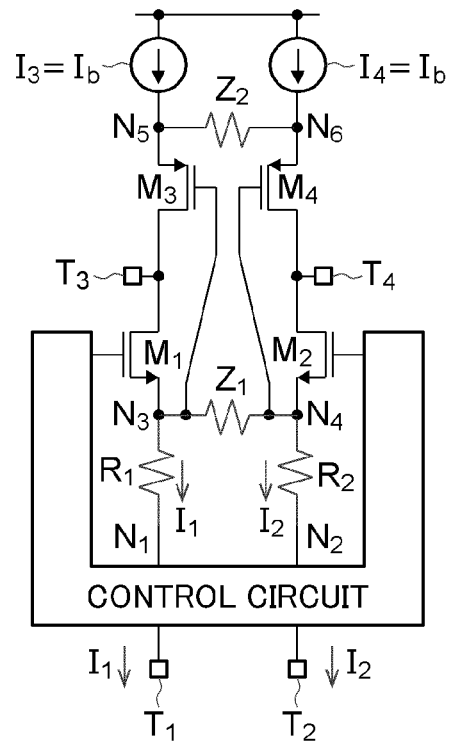
FIG. 22 is a diagram illustrating a current amplifier circuit according to a fourth embodiment.

Next, a current amplifier circuit according to a fourth embodiment will be described with reference to FIG. 22. Here, FIG. 22 is a diagram illustrating the current amplifier circuit according to the fourth embodiment. As illustrated in FIG. 22, the current amplifier circuit according to the present embodiment includes a transistor $M_1$, a resistor $R_1$, a transistor $M_2$, a resistor $R_2$, a passive element $Z_1$, a control circuit, a transistor $M_3$, a transistor $M_4$, a passive element $Z_2$, and current sources $I_3$ and $I_4$. According to the present embodiment, a gate terminal of the transistor $M_3$ ($M_4$) is connected to a source terminal of the transistor $M_1$ ($M_2$), and the configurations of other components are same as the third embodiment.

Next, operation of the current amplifier circuit according to the present embodiment will be described. Voltage $V_1$ ($V_2$) at a node $N_1$ ($N_2$) is controlled to be same by the control circuit, and therefore, when current $I_1$ ($I_2$) received from an input terminal $T_1$ ($T_2$) becomes larger, voltage $V_3$ ($V_4$) at a node $N_3$ ($N_4$) becomes large. A gate terminal of the transistor $M_3$ ($M_4$) is connected to a source terminal of the transistor $M_1$ ($M_2$), namely, the node $N_3$ ($N_4$), and therefore the voltage at the gate terminal of the transistor $M_3$ ($M_4$) becomes high. Since the transistor $M_3$ ($M_4$) is a PMOS transistor, drain current $I_{M3}$ ($I_{M4}$) becomes small when the voltage at the gate terminal becomes high.

In the same manner, when the current $I_1$ ($I_2$) received from the input terminal $T_1$ ($T_2$) becomes small, the voltage $V_3$ ($V_4$) at the node $N_3$ ($N_4$) becomes low, and also the voltage at the gate terminal of the transistor $M_3$ ($M_4$) becomes low and the drain current $I_{M3}$ ($I_{M4}$) becomes large. Thus, the transistor $M_3$ ($M_4$) complementarily operates with respect to the transistor $M_1$ ($M_2$). Therefore, in the current amplifier circuit according to the present embodiment, signal current $I_{SIG}$ contained in an output signal output from the output terminals $T_3$ and $T_4$ is a sum of $I_{M1}-I_{M2}$ and $I_{M3}-I_{M4}$, and signal current can be amplified larger than the current amplifier circuit according to the first embodiment, same as the third embodiment. Meanwhile, according to the present embodiment, in the case where the current $I_1$ and $I_2$ are small and the transistors $M_3$ and $M_4$ operate in a saturation region, the current $I_{M3}$ and $I_{M4}$ change in accordance with $\Delta_R$. Therefore, the source terminals of the transistors $M_3$ and $M_4$ may be short-circuited ($Z_2=0$).

(Fifth Embodiment)

Figure 23:
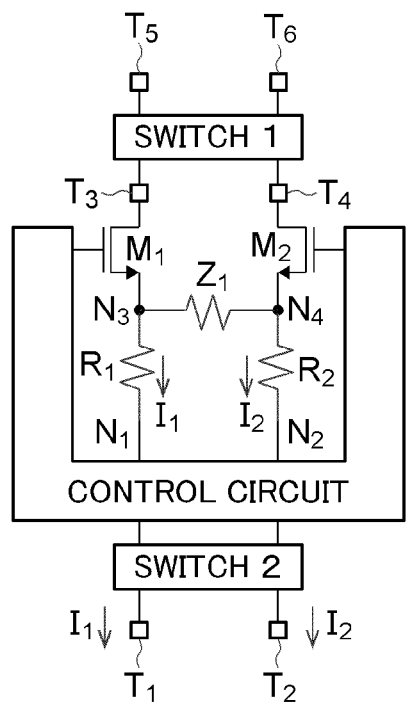
FIG. 23 is a diagram of a current amplifier circuit according to a fifth embodiment.

Next, a current amplifier circuit according to a fifth embodiment will be described with reference to FIGS. 23 to 25. Here, FIG. 23 is a diagram illustrating the current amplifier circuit according to the fifth embodiment. As illustrated in FIG. 23, the present embodiment is a modified example of the first embodiment, and includes a switching circuit whereby paths are switched such that current $I_{M1}$ flowing in a transistor $M_1$ and current $I_{M2}$ flowing in a transistor $M_2$ are alternately switched. The switching circuit includes a switch 1 and a switch 2.

The switch 1 (first switch) is a chopper circuit that switches a path between a path of the current $I_{M1}$ output from a drain terminal of the transistor $M_1$ and a path of the current $I_{M2}$ output from a drain terminal of the transistor $M_2$. The switch 1 is disposed between output terminals $T_3$, $T_4$ of the current amplifier circuit and input terminals $T_5$, $T_6$ of a post-stage circuit where output signals are received from the current amplifier circuit. The switch 1 alternately switches the path between the path in which the output terminal $T_3$ and the input terminal $T_5$ are connected and also the output terminal $T_4$ and the input terminal $T_6$ are connected, and the path in which the output terminal $T_3$ and the input terminal $T_6$ are connected and also the output terminal $T_4$ and input terminal $T_5$ are connected.

In the case where the output terminal $T_3$ and the input terminal $T_5$ are connected and the output terminal $T_4$ and the input terminal $T_6$ are connected by the switch 1, the current $I_{M1}$ output from the output terminal $T_3$ is received in the input terminal $T_5$ and the current $I_{M2}$ output from the output terminal $T_4$ is received in the input terminal $T_6$. When the switch 1 switches the path, the output terminal $T_3$ is connected to the input terminal $T_6$ and the output terminal $T_4$ is connected to the input terminal $T_5$. Due to this, the current $I_{M1}$ output from the output terminal $T_3$ is received in the input terminal $T_6$, and the current $I_{M2}$ output from the output terminal $T_4$ is received in the input terminal $T_5$.

The switch 2 (second switch) is a chopper circuit that switches the path between a path of current $I_1$ received from the other end of a resistor $R_1$, namely, a node $N_1$, and a path of current $I_2$ received from the other end of a resistor $R_2$, namely, a node $N_2$. The switch 2 is disposed between the input terminals $T_1$, $T_2$ and the nodes $N_1$, $N_2$ in the current amplifier circuit. The switch 2 alternately switches the path between the path in which the input terminal $T_1$ and the node $N_1$ are connected and also the input terminal $T_2$ and the node $N_2$ are connected, and the path in which the input terminal $T_1$ and the node $N_2$ are connected and also the input terminal $T_2$ and the node $N_1$ are connected.

In the case where the input terminal $T_1$ and the node $N_1$ are connected and the input terminal $T_2$ and the node $N_2$ are connected by the switch 2, the current $I_1$ received from the input terminal $T_1$ is received at the node $N_1$ via a control circuit and the current $I_2$ received from the input terminal $T_2$ is received at the node $N_2$ via the control circuit. When the switch 2 switches the path, the input terminal $T_1$ is connected to the node $N_2$ and the input terminal $T_2$ is connected to the node $N_1$. Due to this, the current $I_1$ received from the input terminal $T_1$ is received at the node $N_2$ via the control circuit, and the current $I_2$ received from the input terminal $T_2$ is received at the node $N_1$ via the control circuit.

Switching timings of the switch 1 and the switch 2 are synchronized. The switches 1 and 2 operate such that the switch 2 connects the input terminal $T_1$ ($T_2$) to the node $N_1$ ($N_2$) in the case where the switch 1 connects the output terminal $T_3$ ($T_4$) to the input terminal $T_5$ ($T_6$), and the switch 2 connects the input terminal $T_1$ ($T_2$) to the node $N_2$ ($N_1$) in the case where the switch 1 connects the output terminal $T_3$ ($T_4$) to the input terminal $T_6$ ($T_5$).

Figure 24A:
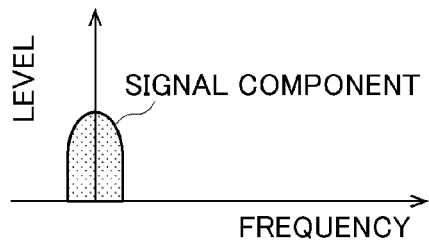
FIGS. 24A to 24F are explanatory diagrams illustrating signal changes caused by operation of a switching circuit.
Figure 24D:
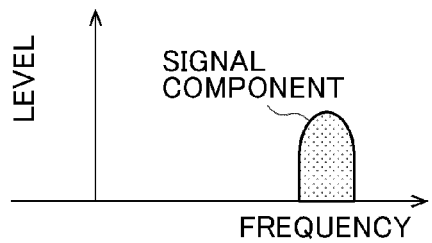
Figure 24B:
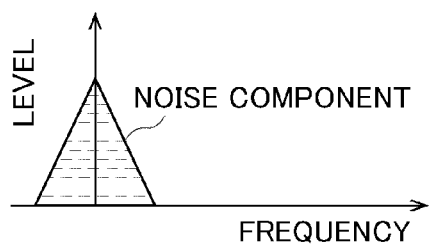
Figure 24E:
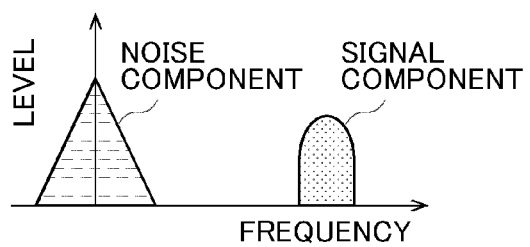
Figure 24C:
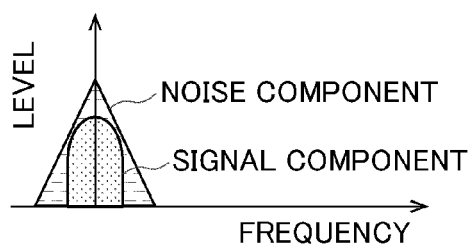

FIGS. 24A to 24F are diagrams for describing changes of a signal by the operation of the switching circuit. In the following, a description will be given for the case in which a signal component exists in a low-frequency region of an input signal as illustrated in FIG. 24A. The current amplifier circuit sometimes generates noise in the process of amplifying the input signal. Particularly, flicker noise (1/f noise) may be generated in the low-frequency region as illustrated in FIG. 24B. In the case where such noise is generated, the output signal of the current amplifier circuit becomes a signal in which a signal component and a noise component are superimposed in the low-frequency region, as illustrated in FIG. 24C.

On the other hand, in the case where the signal is amplified while the switching circuit switches the path at a predetermined frequency, the signal component contained in the input signal is shifted to a high-frequency region by an amount of frequency switched by the switch 2 as illustrated in FIG. 24D. The output signal becomes a signal in which the signal component shifted to the high-frequency region and the noise component in the above-mentioned low-frequency region are superimposed. Therefore, as illustrated in FIG. 24E, the signal component contained in the output signal and the noise component are not overlapped.

Figure 24F:
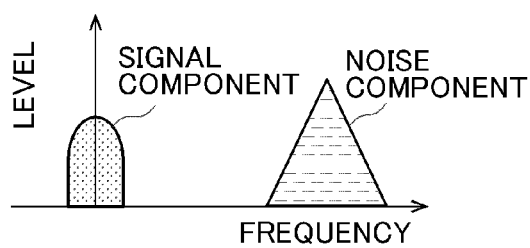

In the output signal, switching frequency is combined again by the switch 1. Here, in the case of setting phases of the switching frequency of the switch 1 and switch 2 inversed, the signal component contained in the output signal is returned to the low-frequency region, and the noise component is shifted to the high-frequency region, as illustrated in FIG. 24F. Therefore, in the current amplifier circuit according to the present embodiment, the noise component can be easily removed from the output signal by a filter such as a lowpass filter. With this configuration, influence of the noise generated in the current amplifier circuit can be suppressed.

(First Working Example)

Figure 25:
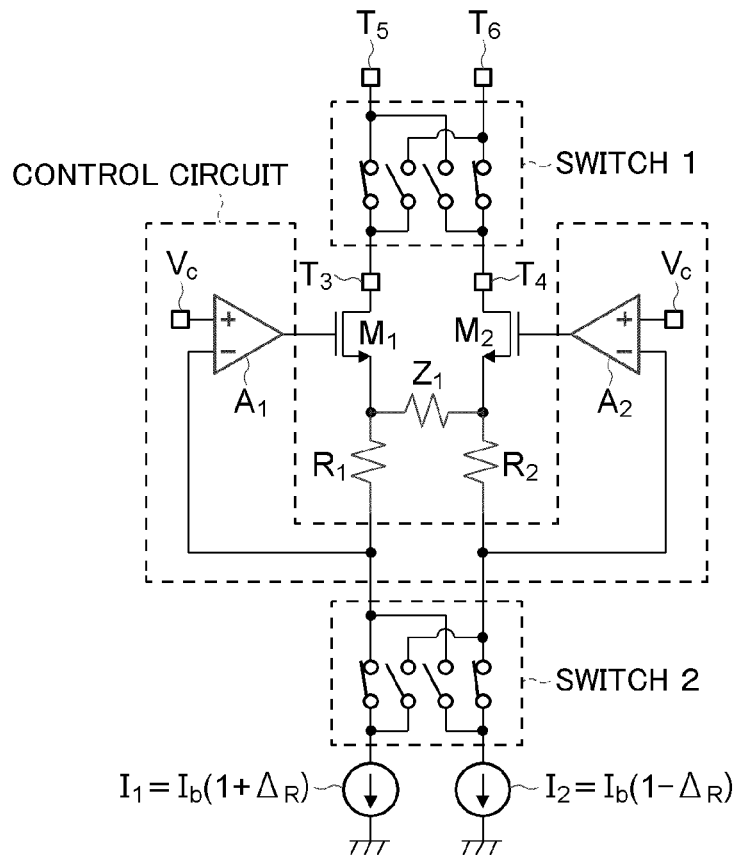
FIG. 25 is a diagram illustrating a first working example according to the fifth embodiment.

FIG. 25 is a first working example of the present embodiment. The present working example is a concrete example of the fifth embodiment, where the switching circuit is applied in the current amplifier circuit of the first working example according to the first embodiment. With this configuration, the noise generated at the current amplifier circuit can be easily removed from the output signal.

(Sixth Embodiment)

Figure 26:
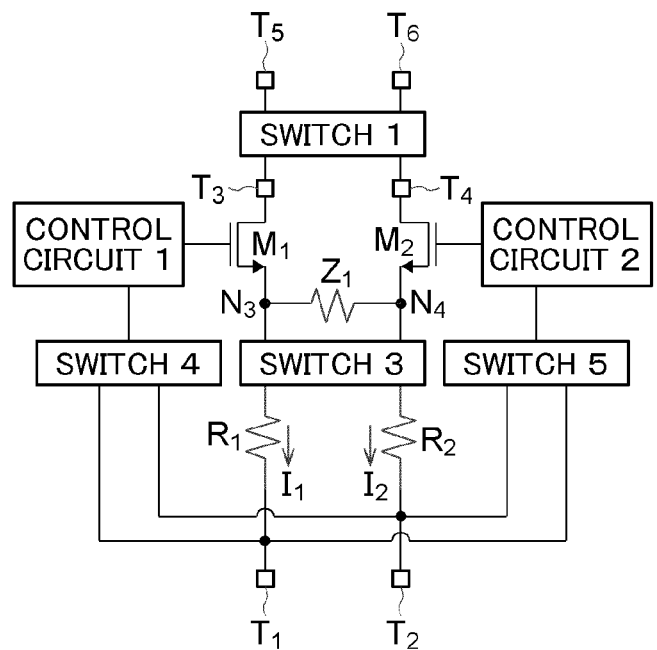
FIG. 26 is a diagram of a current amplifier circuit according to a sixth embodiment.

Next, a current amplifier circuit according to a sixth embodiment will be described with reference to FIGS. 26 and 27. Here, FIG. 26 is a diagram illustrating the current amplifier circuit according to the sixth embodiment. As illustrated in FIG. 26, the present embodiment is a modified example of the fifth embodiment, and includes a switching circuit whereby paths are switched such that current $I_{M1}$ flowing in a transistor $M_1$ and current $I_{M2}$ flowing in a transistor $M_2$ are alternately switched. In the description of the present embodiment, a control circuit portion for controlling voltage at a gate terminal of the transistor $M_1$ is referred to as control circuit 1, and a control circuit portion for controlling voltage at a gate terminal of the transistor $M_2$ is referred to as control circuit 2. The configurations of other components are same as the first embodiment. The switching circuit includes a switch 1, a switch 3, a switch 4, and a switch 5. Note that description for the configuration of the switch 1 will be omitted here as is same as the fifth embodiment.

The switch 3 (third switch) is a chopper circuit that switches a path between one end of a resistor $R_1$, namely, a path of current $I_1$ output from the side of a node $N_3$ of the resistor $R_1$, and one end of a resistor $R_2$, namely, a path of current $I_2$ output from the side of a node $N_4$ of the resistor $R_2$. The switch 3 is disposed between the resistors $R_1$, $R_2$ and the nodes $N_3$, $N_4$. The switch 3 alternately switches the path between the path in which the resistor $R_1$ and the node $N_3$ are connected and also the resistor $R_2$ and the node $N_4$ are connected, and the path in which the resistor $R_1$ and the node $N_4$ are connected and also the resistor $R_2$ and the node $N_3$ are connected.

In the case where the resistor $R_1$ and the node $N_3$ are connected and the resistor $R_2$ and the node $N_4$ are connected by the switch 3, the current $I_1$ output from one end of the resistor $R_1$ is received at the node $N_3$ and the current $I_2$ output from one end of the resistor $R_2$ is received at the node $N_4$. When the switch 3 switches the path, the resistor $R_1$ is connected to the node $N_4$ and the resistor $R_2$ is connected to the node $N_3$. Due to this, the current $I_1$ output from one end of the resistor $R_1$ is received at the node $N_4$, and the current $I_2$ output from one end of the resistor $R_2$ is received at the node $N_3$.

The switch 4 (fourth switch) is a chopper circuit that switches the path for the current $I_1$ and $I_2$ received in the control circuit 1 in order to control the voltage at the gate terminal of the transistor $M_1$. The switch 4 is disposed between the input terminals $T_1$, $T_2$ and the control circuit 1. The switch 4 alternatively switches the path between the path in which the input terminal $T_1$ and the control circuit 1 are connected, and the path in which the input terminal $T_2$ and the control circuit 1 are connected.

In the case where the input terminal $T_1$ and the control circuit 1 are connected by the switch 4, the voltage at the input terminal $T_1$, namely the voltage at the other end of the resistor $R_1$ is received in the control circuit 1. When the switch 4 switches the path, the input terminal $T_2$ is connected to the control circuit 1 and the voltage at the input terminal $T_2$, namely the voltage at the other end of the resistor $R_2$ is received in the control circuit 1.

The switch 5 (fifth switch) is a chopper circuit that switches the path for the current $I_1$ and $I_2$ received in the control circuit 2 in order to control the voltage at the gate terminal of the transistor $M_2$. The switch 5 is disposed between the input terminals $T_1$, $T_2$ and the control circuit 2. The switch 5 alternatively switches the path between the path in which the input terminal $T_1$ and the control circuit 2 are connected, and the path in which the input terminal $T_2$ and the control circuit 2 are connected.

In the case where the input terminal $T_1$ and the control circuit 2 are connected by the switch 5, the voltage at the input terminal $T_1$, namely the voltage at the other end of the resistor $R_1$ is received in the control circuit 2. When the switch 5 switches the path, the input terminal $T_2$ is connected to the control circuit 2 and the voltage at the input terminal $T_2$, namely, the voltage at the other end of the resistor $R_2$ is received in the control circuit 2.

Switching timings of the switches 1, 3, 4 and 5 are synchronized. In the case where the switch 1 connects an output terminal $T_3$ ($T_4$) to an input terminal $T_5$ ($T_6$), the switch 3 connects the resistor $R_1$ ($R_2$) to the node $N_3$ ($N_4$), the switch 4 connects the input terminal $T_1$ to the control circuit 1, and the switch 5 connects the input terminal $T_2$ to the control circuit 2. In this case, signal current of the current $I_1$ ($I_2$) received from the input terminal $T_1$ ($T_2$) is amplified and received in the input terminal $T_5$ ($T_6$). The control circuit 1 (control circuit 2) forms a negative feedback circuit together with the transistor $M_1$ ($M_2$) and the resistor $R_1$ ($R_2$), and controls the voltage at the gate terminal of the transistor $M_1$ ($M_2$) such that voltage at a node $N_1$ ($N_2$) becomes a predetermined voltage.

On the other hand, in the case where the switch 1 connects an output terminal $T_3$ ($T_4$) to an input terminal $T_6$ ($T_5$), the switch 3 connects the resistor $R_1$ ($R_2$) to the node $N_4$ ($N_3$), the switch 4 connects the input terminal $T_2$ to the control circuit 1, and the switch 5 connects the input terminal $T_1$ to the control circuit 2. In this case, the signal current of the current $I_1$ ($I_2$) received from the input terminal $T_1$ ($T_2$) is amplified and received in the input terminal $T_5$ ($T_6$). The control circuit 1 (control circuit 2) forms the negative feedback circuit together with the transistor $M_1$ ($M_2$) and the resistor $R_2$ ($R_1$), and controls the voltage at the gate terminal of the transistor $M_1$ ($M_2$) such that voltage at a node $N_2$ ($N_1$) becomes the predetermined voltage.

With the above-described structure, in the current amplifier circuit according to the present embodiment, noise component can be easily removed from the output signal by a filter such as a lowpass filter in the same manner as the fifth embodiment. Due to this, influence of the noise generated in the current amplifier circuit can be suppressed.

(First Working Example)

Figure 27:
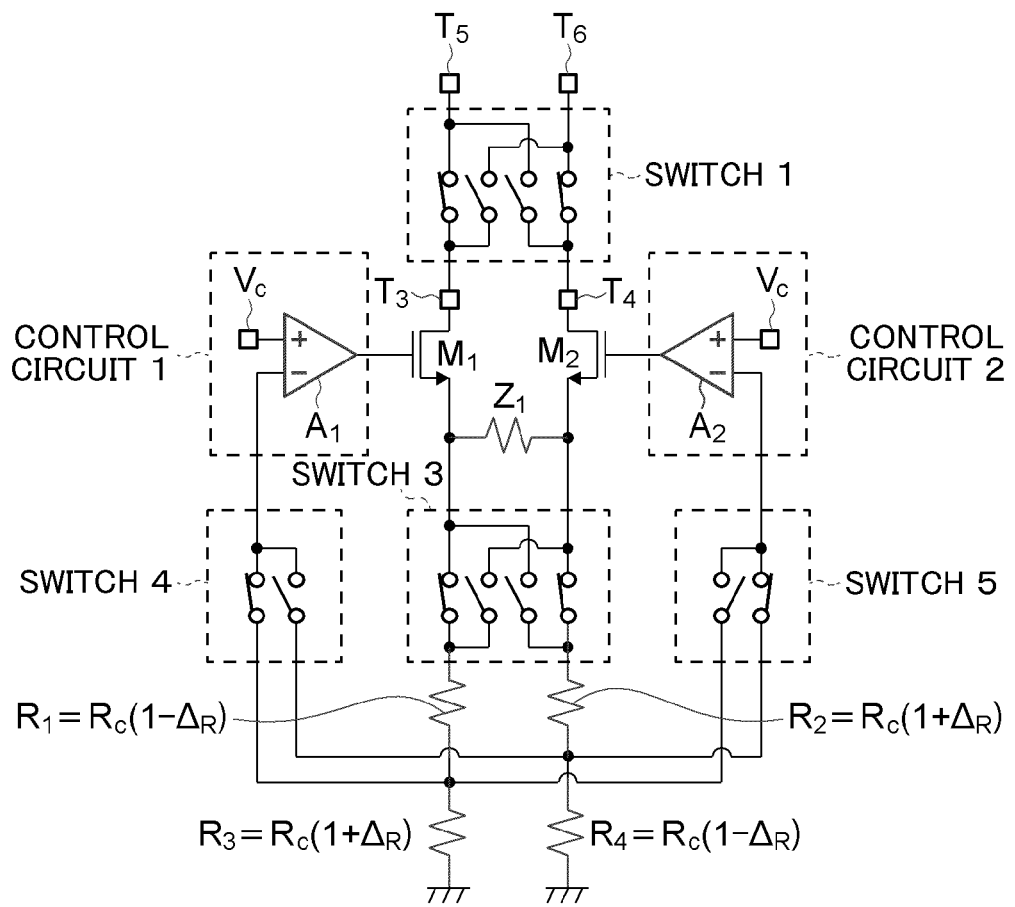
FIG. 27 is a diagram illustrating a first working example according to the sixth embodiment.

FIG. 27 is a diagram illustrating a first working example of the present embodiment. The present working example is a concrete example of the present embodiment, where the switching circuit is applied in a fourth working example of the first embodiment. In the present working example, the control circuit 1 is an amplifier circuit $A_1$, and the control circuit 2 is an amplifier circuit $A_2$. With this configuration, the noise generated in the current amplifier circuit can be easily removed from the output signal.

(Seventh Embodiment)

Figure 28:
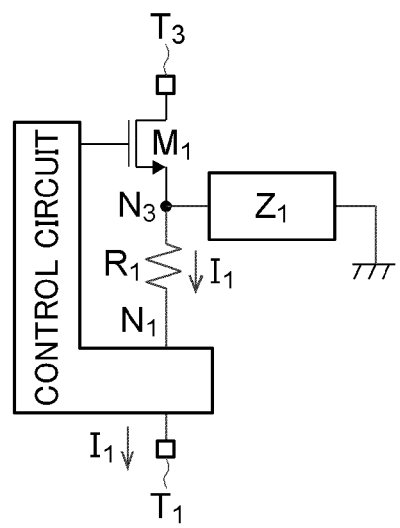
FIG. 28 is a diagram of a current amplifier circuit according to a seventh embodiment.

Next, a current amplifier circuit according to a seventh embodiment will be described with reference to FIGS. 28 to 30. Here, FIG. 28 is a diagram illustrating the current amplifier circuit according to the seventh embodiment. As illustrated in FIG. 28, the current amplifier circuit according to the present embodiment includes a transistor $M_1$, a resistor $R_1$, a passive element $Z_1$, and a control circuit. In other words, the current amplifier circuit according to the present embodiment is formed of a current amplifier circuit according to the above-described embodiments in a single-ended configuration.

The transistor $M_1$ (first transistor) is an NMOS transistor having a source terminal (first terminal) connected to the resistor $R_1$ and the passive element $Z_1$ at a node $N_3$, a drain terminal (second terminal) connected to an output terminal $T_3$, and a gate terminal (control terminal) connected to the control circuit. Voltage at the gate terminal of the transistor $M_1$ is controlled by the control circuit, and drain current $I_{M1}$ flows in the transistor $M_1$.

The resistor $R_1$ (first resistor) has one end connected to the source terminal of the transistor $M_1$ and to the passive element $Z_1$ at the node $N_3$, and the other end connected to the control circuit at a node $N_1$. The resistor $R_1$ may be a fixed resistor having a constant resistance value, or may be a sensor device that detects a state of an object by change of the resistance value.

The passive element $Z_1$ (first passive element) has one end connected to the source terminal of the transistor $M_1$ and to one end of the resistor $R_1$ at the node $N_3$, and the other end connected to the ground (reference potential). The passive element $Z_1$ is formed of at least a capacitor, and an operating point of the current amplifier circuit is fixed by this capacitor. The passive element $Z_1$ may include resistor.

The control circuit is connected to the gate terminal of the transistor $M_1$, the other end of the resistor $R_1$, and an input terminal $T_1$. The control circuit controls the voltage at the gate terminal of the transistor $M_1$ such that voltage at the other end of the resistor $R_1$ becomes equal to a predetermined voltage (first predetermined voltage), namely, such that voltage $V_1$ at the node $N_1$ becomes equal to the predetermined voltage. Further, the control circuit executes control such that current $I_1$ received from the input terminal $T_1$ is applied to the resistor $R_1$.

Next, operation of the current amplifier circuit according to the present embodiment will be described. In the following description, the resistor $R_1$ is a fixed resistor: $R_1 = R_C$. The voltage $V_1$ at the node $N_1$ is controlled by the control circuit to be a voltage value $V_C$ ($V_1 = V_C$). Also, the current $I_1$ is: $I_1 = I_b (1 + \Delta_R)$. More specifically, a description will be given for a case in which the current amplifier circuit is connected to a sensor device, and signal current is received from the input terminal $T_1$.

When the current $I_1$ is received from the input terminal $T_1$, the voltage $V_3$ at the node $N_3$ is: $V_3 = V_1 + R_1 I_1$. When following values $R_1=R_C$, $I_1=I_b(1+\Delta_R)$, and $V_1=V_C$ are plugged into the above formula, the voltage $V_3$ becomes: $V_3=V_C+R_1I_b+R_1I_b\Delta_R$.

Since the passive element $Z_1$ is connected between the node $N_3$ and the ground, the voltage $V_3$ at the node $N_3$ is applied. The passive element $Z_1$ includes the capacitor, and therefore direct current does not flow. For this reason, following current $I_{Z1}$ corresponding to an AC component of the voltage $V_3$, namely, $R_1I_b\Delta_R$ flows in the passive element $Z_1$, and the current $I_{Z1}$ is: $I_{Z1}=R_1I_b\Delta_R/Z_1$. Due to this, the current $I_{M1}$ flowing in the transistor $M_1$ becomes: $I_{M1}=I_1+I_{Z1}=I_b+\Delta_RI_b+R_CI_b\Delta_R/Z_1$. According to the present embodiment, the current $I_{M1}$ becomes an output signal output from the output terminal $T_3$.

Therefore, bias current $I_B$ flowing in the entire circuit becomes: $I_B=I_b$. And, signal current $I_{SIG}$ contained in the output signal becomes: $I_{SIG}=\Delta_RI_b+R_CI_b\Delta_R/Z_1$. As described above, the signal current is amplified and further amplification of the bias current can be suppressed in the current amplifier circuit according to the present embodiment, same as the above-described embodiment. Due to this, the ratio between the bias current and the signal current can be improved and power consumption in the current amplifier circuit can be suppressed, compared to the current amplifier circuit according to the related art.

(First Working Example)

Figure 29:
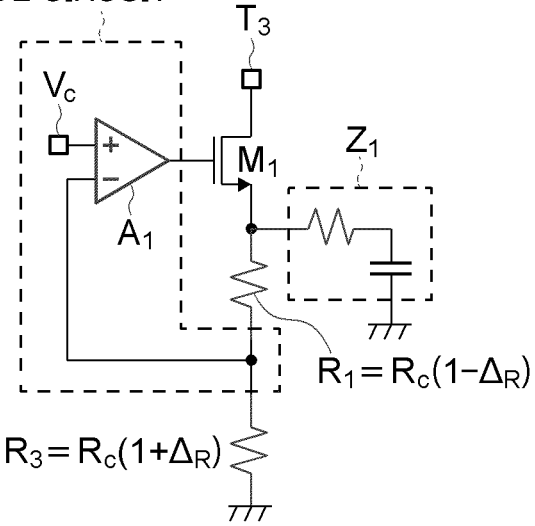
FIG. 29 is a diagram illustrating a first working example according to the seventh embodiment.

FIG. 29 is a first working example of the present embodiment. According to the present working example, the current amplifier circuit includes an amplifier circuit $A_1$ as a control circuit. The amplifier circuit $A_1$ has a positive input terminal from which predetermined bias voltage $V_C$ is applied, a negative input terminal connected to the other end of the resistor $R_1$ at the node $N_1$, and an output terminal connected to the gate terminal of the transistor $M_1$. Further, a resistor $R_3$ is connected to the input terminal $T_1$, and current $I_1R_3$ generated at the resistor $R_3$ becomes an input signal. The resistors $R_1$ and $R_3$ are sensor devices having following resistance values that change in the opposite direction, centering a predetermined resistance value $R_C$: $R_1=R_C(1-\Delta_R)$ and $R_3=R_C(1+\Delta_R)$.

In the following, operation of the control circuit (amplifier circuit $A_1$) according to the present working example will be described. The amplifier circuit $A_1$ forms a feedback circuit together with the transistor $M_1$ and the resistor $R_1$, and executes feedback control such that the voltage at the positive and negative terminals of the amplifier circuit $A_1$ become equal. In other words, the amplifier circuit $A_1$ controls the voltage at the gate terminal of the transistor $M_1$ such that the voltage at the negative input terminal (voltage $V_1$ at the node $N_1$) becomes equal to the bias voltage $V_C$. With this configuration, the voltage $V_1$ at the node $N_1$ is controlled to be equal to the bias voltage $V_C$ applied to the positive input terminal of the amplifier circuit $A_1$.

Note that the current consumed by the operation of the amplifier circuit $A_1$ is smaller than the bias current received in the current amplifier circuit. Therefore, the ratio between the bias current and the signal current can be improved in the current amplifier circuit according to the present working example, compared to the current amplifier circuit according to the related art.

(Second Working Example)

Figure 30:
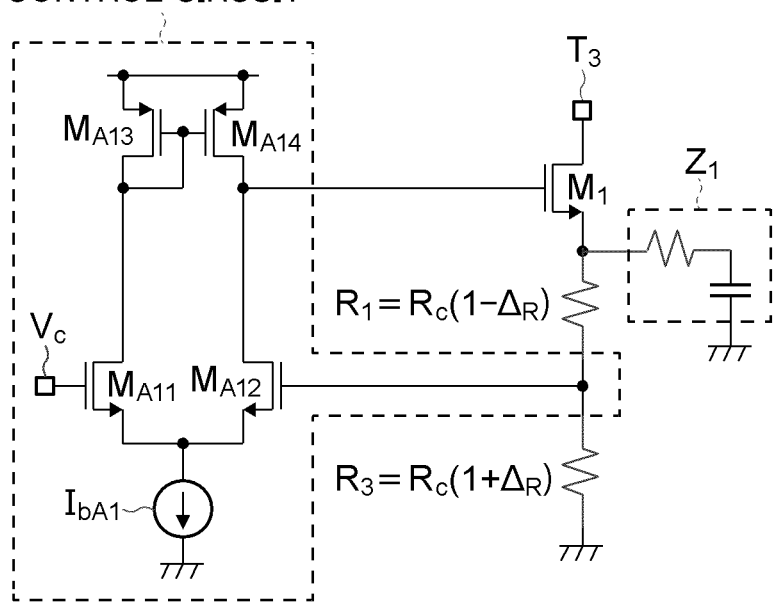
FIG. 30 is a diagram illustrating a second working example according to the seventh embodiment.

FIG. 30 is a second working example of the present embodiment. The present working example is a concrete example of the first working example, and formed of an amplifier circuit in which the amplifier circuit $A_1$ of the first working example includes a plurality of transistors. Further, the passive element $Z_1$ includes the capacitor and the resistor. The amplifier circuit $A_1$ includes a transistor $M_{A11}$, a transistor $M_{A12}$, a transistor $M_{A13}$, a transistor $M_{A14}$, and a current source $I_{bA1}$. The transistors $M_{A11}$ and $M_{A12}$ are NMOS transistors and the transistors $M_{A13}$ and $M_{A14}$ are PMOS transistors.

The transistor $M_{A11}$ has a gate terminal from which the predetermined bias voltage $V_C$ is applied, and a source terminal connected to the current source $I_{bA1}$. The transistor $M_{A12}$ has a gate terminal connected to the node $N_1$, and a source terminal connected to the current source $I_{bA1}$. The transistor $M_{A13}$ and the transistor $M_{A14}$ form a current mirror circuit, and a drain terminal of the transistor $M_{A14}$ is connected to the gate terminal of the transistor $M_1$. With this configuration, the voltage at the transistor $M_1$ is controlled by the amplifier circuit $A_1$ such that the voltage $V_1$ at the node $N_1$ becomes equal to the bias voltage $V_C$.

(Eighth Embodiment)

Figure 31:
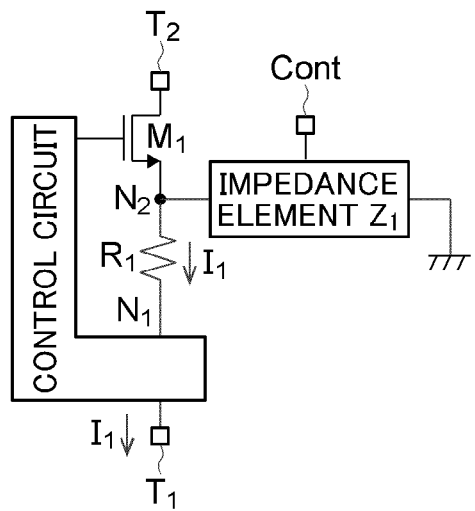
FIG. 31 is a diagram of a current amplifier circuit according to an eighth embodiment.

Next, a current amplifier circuit according to an eighth embodiment will be described with reference to FIGS. 31 and 32. Here, FIG. 31 is a diagram illustrating the current amplifier circuit according to the eighth embodiment. As illustrated in FIG. 31, the current amplifier circuit according to the present embodiment includes a transistor $M_1$, a resistor $R_1$, a passive element $Z_1$, and a control circuit, and impedance element $Z_1$ of the passive element $Z_1$ is controlled by a control signal Cont. The configurations of other components are same as the seventh embodiment.

Figure 32:
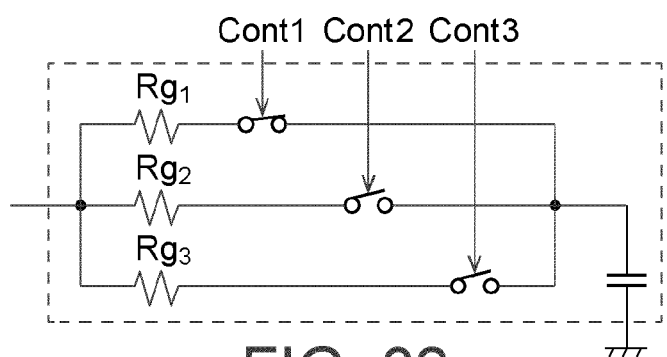
FIG. 32 is a diagram illustrating an example of a passive element in FIG. 31.

The passive element $Z_1$ according to the present embodiment may include, for example, a plurality of resistors connected in parallel, switches connected to the respective resistors in series, and a single capacitor connected to the respective resistors in series, as illustrated in FIG. 32. The impedance element $Z_1$ can be changed by controlling opening and closing of each switch with the control signal Cont. In the current amplifier circuit according to the present embodiment, an amplification factor of the signal current can be controlled by controlling the impedance element $Z_1$ of the passive element $Z_1$ with the control signal Cont. Meanwhile, the passive element $Z_1$ may include a plurality of capacitor connected in series to each of the resistors. Frequency characteristics of the passive element $Z_1$ can be optionally set by adjusting time constant of the resistor and the capacitor connected in series. For example, the frequency characteristics of the passive element $Z_1$ can be set constant by matching the time constant before and after switching of the switch.

(Ninth Embodiment)

Figure 33:
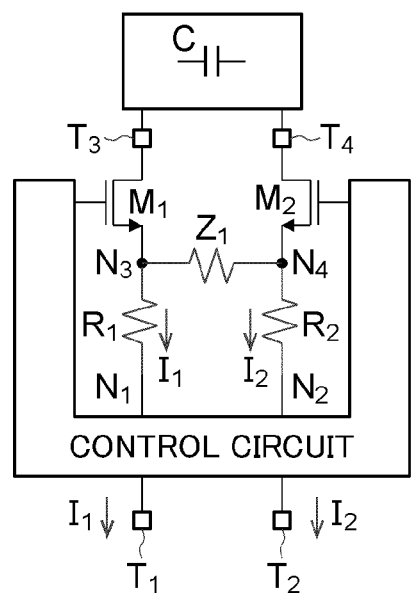
FIG. 33 is a diagram illustrating an integrator according to a ninth embodiment.

Next, an integrator according to a ninth embodiment will be described with reference to FIGS. 33 to 39. Here, FIG. 33 is a diagram illustrating the integrator according to the ninth embodiment. As illustrated in FIG. 33, the integrator according to the present embodiment includes a current amplifier circuit according to the above-described embodiments and an integrating element that integrates an output signal of the current amplifier circuit, and includes a transistor $M_1$, a resistor $R_1$, a transistor $M_2$, a resistor $R_2$, a passive element $Z_1$, and a control circuit. The configurations of the above components are same as a current amplifier circuit according to the first embodiment.

The integrator according to the present embodiment further includes a capacitor element C connected to output terminals $T_3$ and $T_4$. The capacitor element C is formed including at least the capacitor. The capacitor element C integrates the output signal from the output terminals $T_3$ and $T_4$. The integrator can be easily created by the capacitor element C because the output signal of the current amplifier circuit is current.

(First Working Example)

Figure 34:
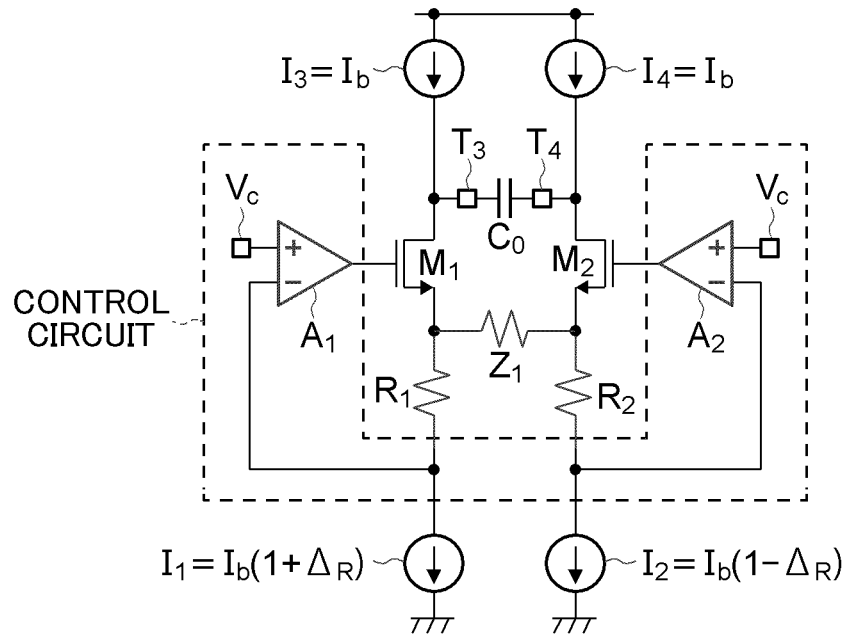
FIGS. 34 to 39 are diagrams illustrating respective working examples according to the ninth embodiment.

FIG. 34 is a first working example of the present embodiment. The present working example is a modified example of the first working example according to the first embodiment, and includes a capacitor $C_0$ as the capacitor element C and further includes current sources $I_3$ and $I_4$. The capacitor $C_0$ is connected to the output terminals $T_3$ and $T_4$, and integrates the output signals. Current $I_3$ and $I_4$ of the current sources $I_3$ and $I_4$ are: $I_3=I_4=I_b$. Therefore, only signal current $I_{SIG}$ contained in the output signal can be integrated by the capacitor $C_O$.

(Second Working Example)

Figure 35:
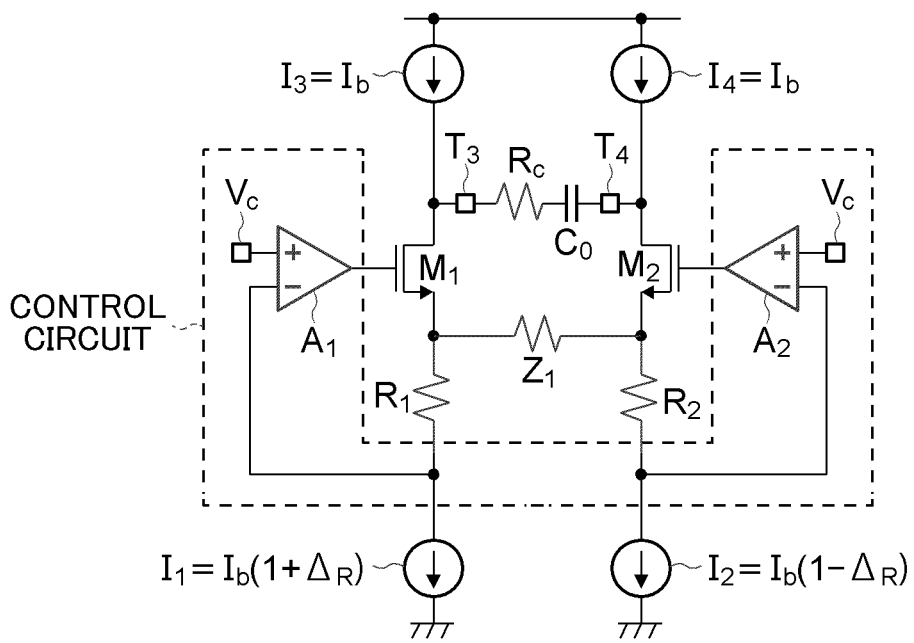

FIG. 35 is a second working example of the present embodiment. The present working example is a modified example of the first working example, and includes the capacitor $C_0$ and a resistor $R_C$ connected to the capacitor $C_0$ in series. With this configuration, phase compensation can be executed by inserting a zero point into the frequency characteristics. In this manner, the operation can be stabilized.

(Third Working Example)

Figure 36:
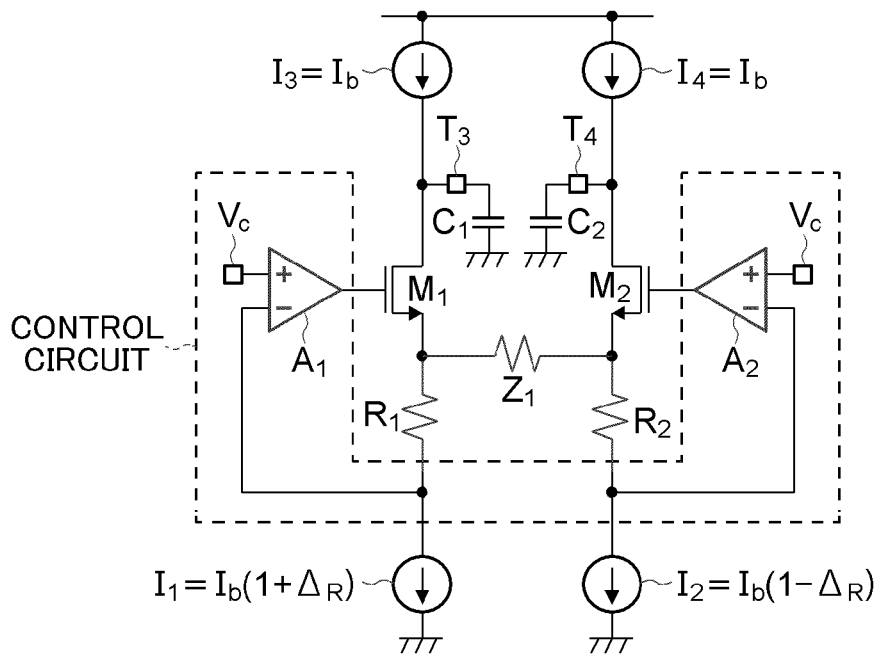

FIG. 36 is a third working example of the present embodiment. The present working example is a modified example of the first working example, and includes capacitor $C_1$ and $C_2$ as the capacitor element C. The capacitor $C_1$ (first capacitor) is connected between ground and the output terminal $T_3$, namely, between the ground and a drain terminal of the transistor $M_1$. The capacitor $C_2$ (second capacitor) is connected between the ground and the output terminal $T_4$, namely, between the ground and a drain terminal of the transistor $M_2$. In the capacitor $C_1$ and $C_2$, the signal current contained in the output signal from the output terminals $T_3$ and $T_4$ is integrated. Meanwhile, in the case of using the integrator according to the present working example as a filter, the resistor may be connected to the capacitor $C_1$ and $C_2$ in series, same as the second working example. Due to this, the zero is introduced into the frequency characteristics, thereby achieving to perform the phase compensation and stabilize the operation.

(Fourth Working Example)

Figure 37:
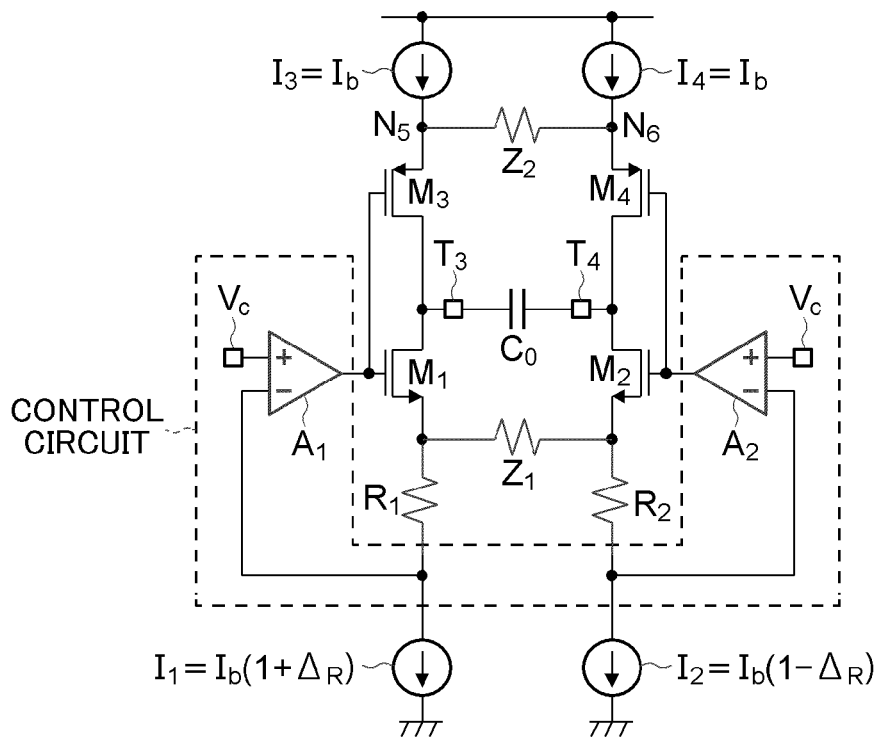

FIG. 37 is a fourth working example of the present embodiment. The present working example is a modified example of the third embodiment, and includes the capacitor $C_0$ connected between the output terminals $T_3$ and $T_4$ as the capacitor element C. According to the present working example also, only the signal current $I_{SIS}$ contained in the output signal can be integrated by the capacitor $C_O$.

(Fifth Working Example)

Figure 38:
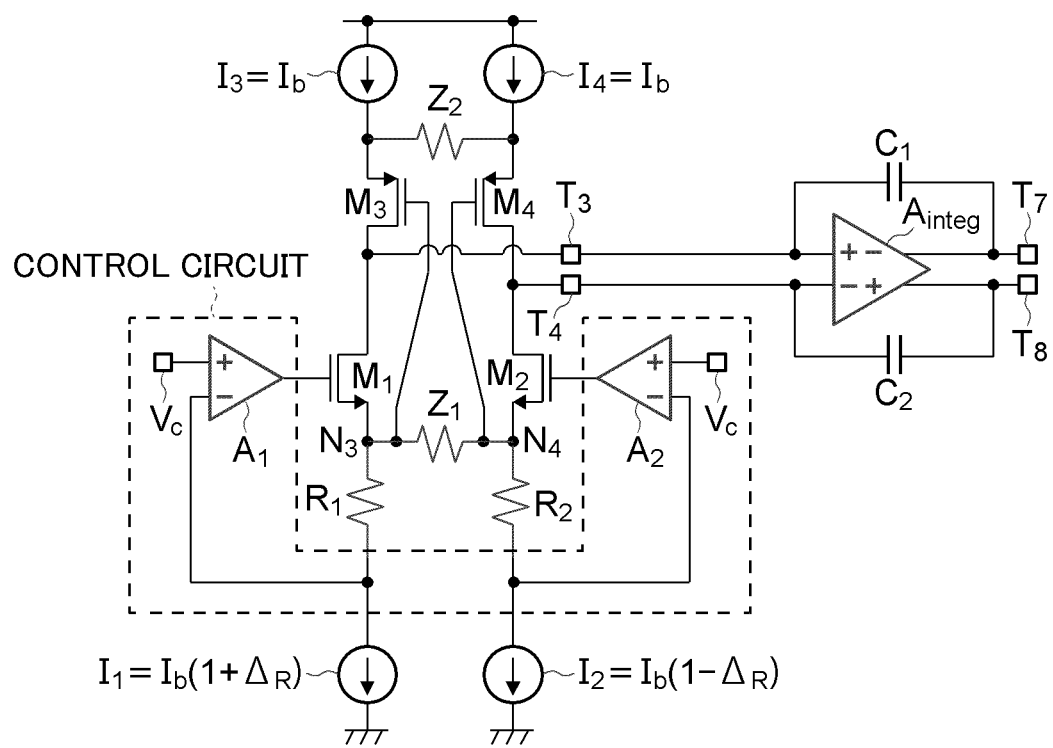

FIG. 38 is a fifth working example of the present embodiment. The present working example is a modified example of the fourth embodiment, and includes the capacitor $C_1$ and $C_2$ as the capacitor element, and further includes an amplifier circuit $A_{integ}$. The amplifier circuit $A_{integ}$ has differential inputs and differential outputs, and has a positive input terminal connected to the output terminal $T_3$ and a negative input terminal connected to the output terminal $T_4$. The capacitor $C_1$ ($C_2$) is connected between the positive input terminal $T_3$ (negative input terminal $T_4$) and the negative output terminal $T_7$ (positive output terminal $T_8$) of the amplifier circuit $A_{integ}$. With this configuration, the input terminals of the amplifier circuit $A_{integ}$ are virtually shorted, and the voltage between input terminals becomes equal. Therefore, even when an output voltage range of the current amplifier circuit is narrow, the output signal can be integrated.

(Sixth Working Example)

Figure 39:
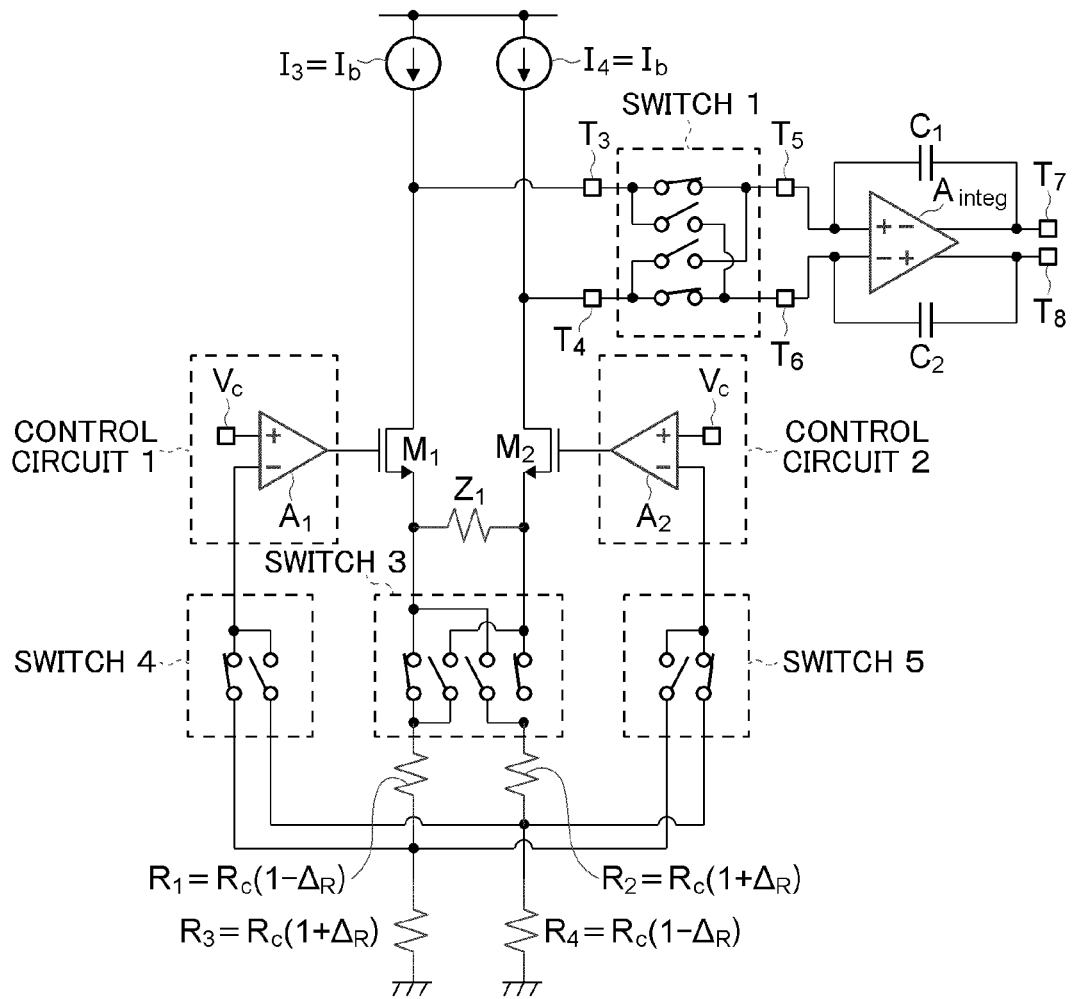

FIG. 39 is a diagram illustrating a sixth working example of the present embodiment. The present working example is a modified example of the first working example of the seventh embodiment, and includes the capacitor $C_1$ and $C_2$ as the capacitor element, and further includes the amplifier circuit $A_{integ}$. The configurations of the capacitor $C_1$, $C_2$ and the amplifier circuit $A_{integ}$ are same as the fifth working example. With this configuration, the input terminals of the amplifier circuit $A_{integ}$ are virtually shorted, and the voltage between the input terminals of the amplifier circuit $A_{integ}$ becomes equal. Therefore, even when an output voltage range of the current amplifier circuit is narrow, the output signal can be integrated. Further, the voltage between input and output of a switch 1, namely, between the output terminals $T_3$, $T_4$ and the input terminals $T_5$ and $T_6$ becomes small, and therefore, in the case of implementing the switch 1 in a MOS transistor, it is possible to suppress distortion of a signal caused by fluctuation of ON-resistance of the switch.

(Tenth Embodiment)

Figure 40:
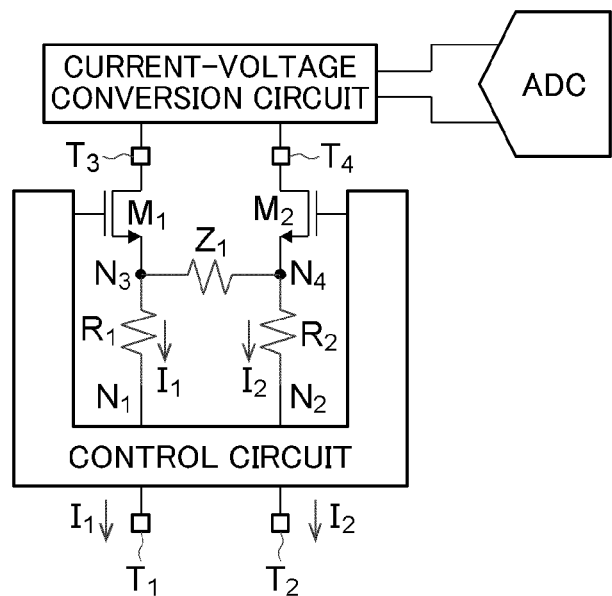
FIG. 40 is a diagram illustrating an AD converter according to a tenth embodiment.

Next, an AD converter according to a tenth embodiment will be described with reference to FIGS. 40 to 42. Here, FIG. 40 is a diagram illustrating the AD converter according to the tenth embodiment. As illustrated in FIG. 40, the AD converter according to the present embodiment includes the current amplifier according to the above-described embodiments, a current-voltage conversion circuit, and an AD conversion circuit ADC. In FIG. 40, the configuration of the current amplifier is same as the first embodiment.

The current-voltage conversion circuit is connected to output terminals $T_3$ and $T_4$ of the current amplifier circuit and the AD conversion circuit ADC. The current-voltage conversion circuit converts differential signal current (output signal) output from the current amplifier circuit to differential signal voltage, and the differential signal voltage is received in the AD conversion circuit ADC. Meanwhile, in the case where the input signal of the AD conversion circuit ADC is current, the current-voltage conversion circuit is unnecessary. In this case, for example, the output terminals $T_3$ and $T_4$ of the current amplifier circuit may be directly connected to the AD conversion circuit ADC.

The AD conversion circuit ADC converts the differential signal voltage received via the current-voltage conversion circuit to a digital signal. This enables a state change of an object detected by a sensor to be output as the digital signal. In the AD converter according to the present embodiment, the AD conversion circuit ADC can be optionally selected. For example, it is possible to use a pipeline AD conversion circuit, a successive-approximation type AD conversion circuit, a single slope AD conversion circuit, a discrete time $\Delta\Sigma$ AD conversion circuit, a continuous time $\Delta\Sigma$ AD conversion circuit, and so on.

(First Working Example)

Figure 41:
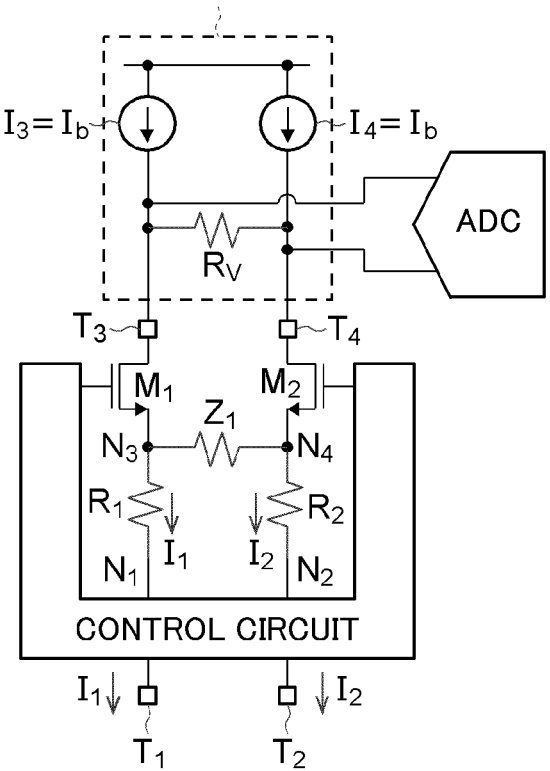
FIG. 41 is a diagram illustrating a first working example according to the tenth embodiment.

FIG. 41 is a diagram illustrating a first working example of the AD converter according to the present embodiment. The present working example is a concrete example of the AD converter in FIG. 40, and the current-voltage converter includes current sources $I_3$, $I_4$ and a resistor $R_V$. The current sources $I_3$ and $I_4$ apply bias current $I_b$, and the resistor $R_V$ is connected between the output terminals $T_3$ and $T_4$. The differential signal current flows in the resistor $R_V$, thereby generating voltage at both ends of the resistor $R_V$, and the generated voltage is received by the AD conversion circuit ADC as the differential signal voltage.

(Second Working Example)

Figure 42:
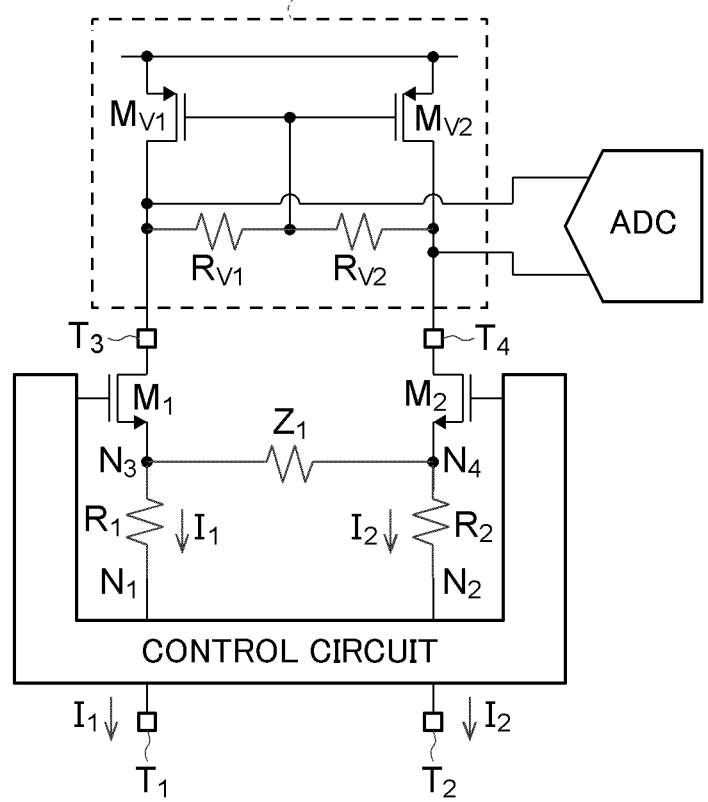
FIG. 42 is a diagram illustrating a second working example according to the tenth embodiment.

FIG. 42 is a diagram illustrating a second working example of the AD converter according to the present embodiment. The present working example is a modified example of the first working example, and the current-voltage converter includes resistors $R_{V1}$, $R_{V2}$ and transistors $M_{V1}$, $M_{V2}$. The resistors $R_{V1}$ and $R_{V2}$ are connected between the output terminals $T_3$ and $T_4$ in series. The transistor $M_{V1}$ ($M_{V2}$) is a PMOS transistor, having a gate terminal mutually connected with a gate terminal of the other transistor, a source terminal connected to a power source, and a drain terminal connected to the output terminals $T_3$ ($T_4$). The resistors $R_{V1}$ and $R_{V2}$ have nodes connected to nodes of the transistors $M_{V1}$ and $M_{V2}$. With this configuration, the output signal of the current amplifier circuit can be converted to the voltage.

(Eleventh Embodiment)

Figure 43:
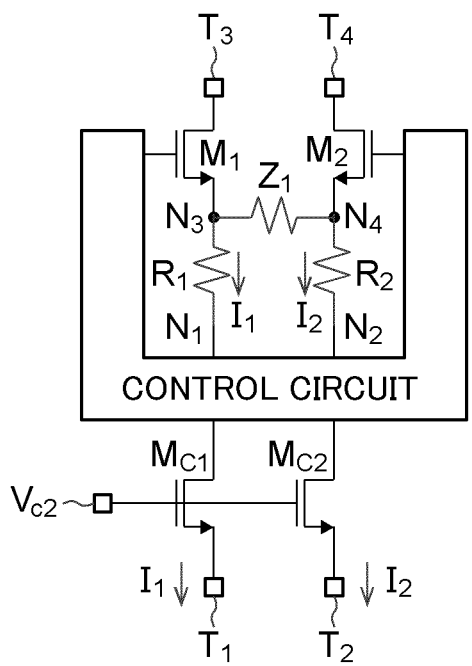
FIG. 43 is a diagram of a current amplifier circuit according to an eleventh embodiment.

Next, a current amplifier circuit according to an eleventh embodiment will be described with reference to FIGS. 43 and 44. Here, FIG. 43 is a diagram illustrating the current amplifier circuit according to the eleventh embodiment. As illustrated in FIG. 43, the current amplifier circuit according to the present embodiment includes a transistor $M_1$, a resistor $R_1$, a transistor $M_2$, a resistor $R_2$, a passive element $Z_1$, and a control circuit. The configurations of the above components are same as the first embodiment. The current amplifier circuit according to the present embodiment further includes a transistor $M_{C1}$ and a transistor $M_{C2}$.

The transistor $M_{C1}$ (fifth transistor) is an NMOS transistor, having a source terminal (first terminal) connected to an input terminal $T_1$ and a drain terminal (second terminal) connected to the control circuit and the other end of the resistor $R_1$ at a node $N_1$, and applied with a predetermined bias voltage $V_{c2}$ (third predetermined voltage) from a gate terminal (control terminal). In other words, the transistor $M_{C1}$ forms a common-gate circuit.

The transistor $M_{C2}$ (sixth transistor) is an NMOS transistor, having a source terminal (first terminal) connected to an input terminal $T_2$ and a drain terminal (second terminal) connected to the control circuit and the other end of the resistor $R_2$ at the node $N_2$, and applied with the predetermined bias voltage $V_{c2}$ from a gate terminal (control terminal). In other words, the transistor $M_{c2}$ forms a common-gate circuit.

With this configuration, the current amplifier circuit according to the present embodiment can suppress influence of the noise of the control circuit onto the output signal. The reason is as follows.

In a case where the control circuit and the input terminals $T_1$ and $T_2$ are directly connected as illustrated in the current amplifier circuit according to the first embodiment, a noise component is superimposed on current $I_1$ and $I_2$ input from the input terminals $T_1$ and $T_2$ respectively due to the influence of the noise of the control circuit. Then, the noise component contained in the current $I_1$ and $I_2$ is converted by the resistors $R_1$ and $R_2$ respectively to the voltage, converted by the passive element $Z_1$ to the current, and superimposed on the output signal. For this reason, for the use of low noise to be required, the control circuit for the low noise is necessary.

On the other hand, in the current amplifier circuit according to the present embodiment, the transistors $M_{c1}$ and $M_{c2}$ are respectively connected between the control circuit and the input terminals $T_1$ and $T_2$, the impedance when the input terminals $T_1$ and $T_2$ are viewed from the control circuit becomes high, the noise component contained in the current $I_1$ and $I_2$ can be reduced. Therefore, influence of the noise of the control circuit on the output signal can be suppressed.

(First Working Example)

Figure 44:
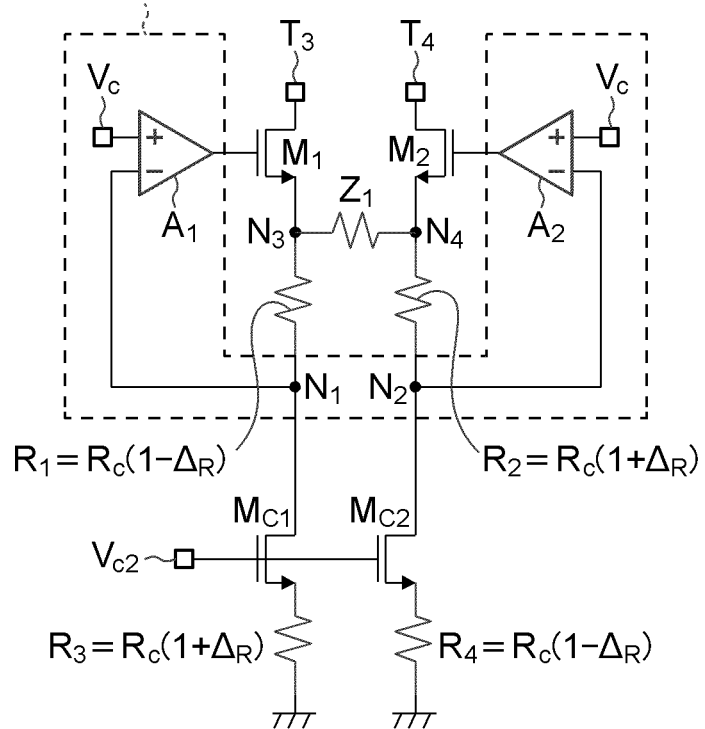
FIG. 44 is a diagram illustrating respective working example according to the eleventh embodiment.

FIG. 44 is a diagram illustrating a first working example of the present embodiment. The present working example is a concrete example of the present embodiment, where the transistors $M_{c1}$ and $M_{c2}$ are provided in the third working example (see FIG. 4) according to the first embodiment.

As described in the present working example, in a case where the transistor $M_{c1}$ is provided between an amplifier circuit $A_1$ and a resistor $R_3$, an input conversion noise $V_{n1}$ of the amplifier circuit $A_1$ is applied to the node $N_1$, the impedance of the input terminal $T_1$ viewed from the amplifier circuit $A_1$ becomes $R_3 \times gm_{Mc1} \times ro_{Mc1}$. Here, $gm_{Mc1}$ is the transconductance of the transistor $M_{c1}$, and $ro_{Mc1}$ is the output resistance of the transistor $M_{c1}$. In the case of $1 \ll gm_{Mc} \times ro_{Mc1}$, the voltage (noise voltage) according to the noise component applied to the source terminal of the transistor $M_1$ (the node $N_3$) becomes $V_{n1} + V_{n1} \times R_1/(R_3 \times gm_{Mc1} \times ro_{Mc1}) \approx V_{n1}$.

On the other hand, as described in the third working example of the first embodiment, in a case where the amplifier circuit $A_1$ and the resistor $R_3$ are directly connected, the input conversion noise $V_{n1}$ of the amplifier circuit $A_1$ is applied to the node $N_1$, the impedance of the input terminal $T_1$ viewed from the amplifier circuit $A_1$ becomes $R_3$. Therefore, the noise component of $V_{n1}/R_3$ is superimposed on the current $I_1$, and the noise component is converted into a voltage by the resistor $R_1$. As a result, the noise voltage applied to the source terminal of the transistor $M_1$ (the node $N_3$) becomes $V_{n1} + V_{n1} \times R_1/R_3 = V_{n1}(R_1+R_3)/R_3$.

Thus, the noise voltage applied to the node $N_3$ can be reduced by disposing the transistor $M_{c1}$ compared to the case where the amplifier circuit $A_1$ and the resistor $R_3$ are directly connected. The same thing is applied for the transistor $M_{c2}$. Therefore, as described above, influence of the noise of the control circuit onto the output signal can be suppressed.

(Twelfth Embodiment)

Figure 45:
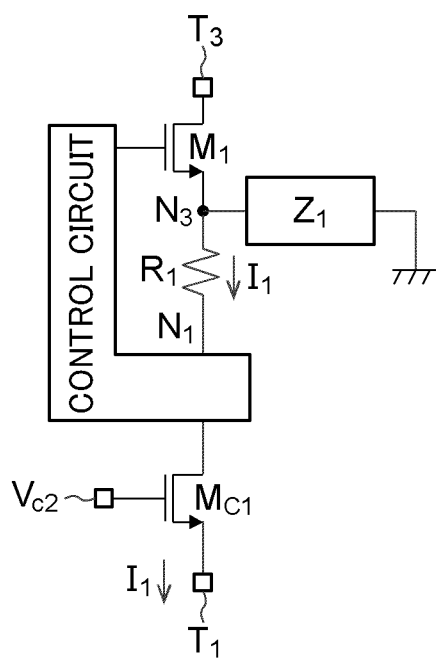
FIG. 45 is a diagram of a current amplifier circuit according to a twelfth embodiment.

Next, a current amplifier circuit according to a twelfth embodiment will be described with reference to FIGS. 45 and 46. Here, FIG. 45 is a diagram illustrating the current amplifier circuit according to the twelfth embodiment. As illustrated in FIG. 45, the current amplifier circuit according to the present embodiment includes a transistor $M_1$, a resistor $R_1$, a passive element $Z_1$, and a control circuit. The configurations of the above components are same as the seventh embodiment. The current amplifier circuit according to the present embodiment further includes a transistor $M_{C1}$.

The transistor $M_{C1}$ (second transistor) is an NMOS transistor, having a source terminal (first terminal) connected to an input terminal $T_1$ and a drain terminal (second terminal) connected to the control circuit and the other end of the resistor $R_1$ at a node $N_1$, and a predetermined bias voltage $V_{c2}$ (second predetermined voltage) is input from a gate terminal (control terminal). In other words, the transistor $M_{c1}$ forms a common-gate circuit.

With this configuration, the current amplifier circuit according to the present embodiment can suppress influence of the noise of the control circuit onto the output signal.

(First Working Example)

Figure 46:
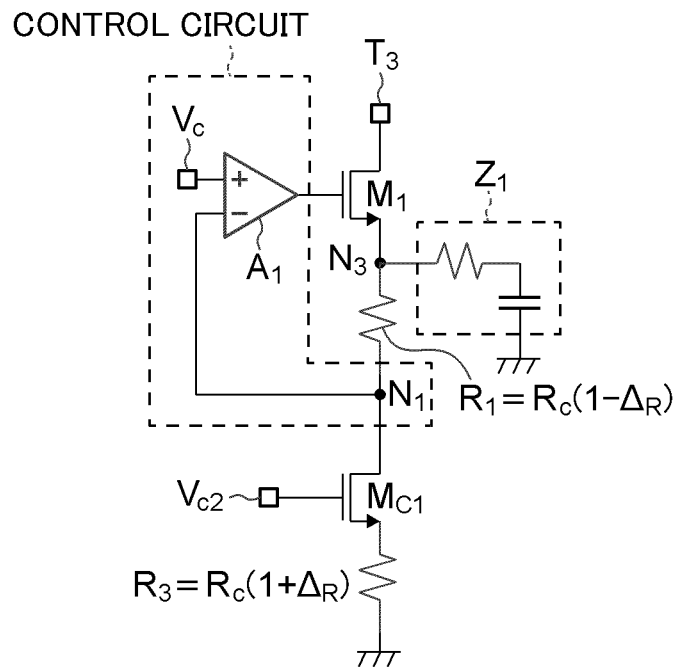
FIG. 46 is a diagram illustrating respective working example according to the twelfth embodiment.

FIG. 46 is a diagram illustrating a first working example of the present embodiment. The present working example is a concrete example of the present embodiment, where the transistor $M_{c1}$ is provided in the first working example (see FIG. 29) of the seventh embodiment.

As described in the present working example, in a case where the transistor $M_{c1}$ is provided between an amplifier circuit $A_1$ and a resistor $R_3$, an input conversion noise $V_{n1}$ of the amplifier circuit $A_1$ is applied to the node $N_1$, the impedance of the input terminal $T_1$ viewed from the amplifier circuit $A_1$ becomes $R_3 \times gm_{Mc1} \times ro_{Mc1}$. Here, $gm_{Mc1}$ is the transconductance of the transistor $M_{c1}$, and $ro_{Mc1}$ is the output resistance of the transistor $M_{c1}$. In the case of $1 \ll gm_{Mc1} \times ro_{Mc1}$, the voltage (noise voltage) according to the noise component applied to the source terminal of the transistor $M_1$ (the node $N_3$) becomes $V_{n1} + V_{n1} \times R_1/(R_3 \times gm_{Mc1} \times ro_{Mc1}) \approx V_{n1}$.

On the other hand, as described in the first working example of the seventh embodiment, in a case where the amplifier circuit $A_1$ and the resistor $R_3$ are directly connected, the input conversion noise $V_{n1}$ of the amplifier circuit $A_1$ is applied to the node $N_1$, the impedance of the input terminal $T_1$ viewed from the amplifier circuit $A_1$ becomes $R_3$. Therefore, the noise component of $V_{n1}/R_3$ is superimposed on the current $I_1$, and the noise component is converted into a voltage by the resistor $R_1$. As a result, the noise voltage applied to the source terminal of the transistor $M_1$ (the node $N_3$) becomes $V_{n1} + V_{n1} \times R_1/R_3 = V_{n1}(R_1+R_3)/R_3$.

Thus, the noise voltage applied to the node $N_3$ can be reduced by disposing the transistor $M_{c1}$ compared to the case where the amplifier circuit $A_1$ and the resistor $R_3$ are directly connected. Therefore, as described above, influence of the noise of the control circuit onto the output signal can be suppressed.

(Thirteenth Embodiment)

Figure 47:
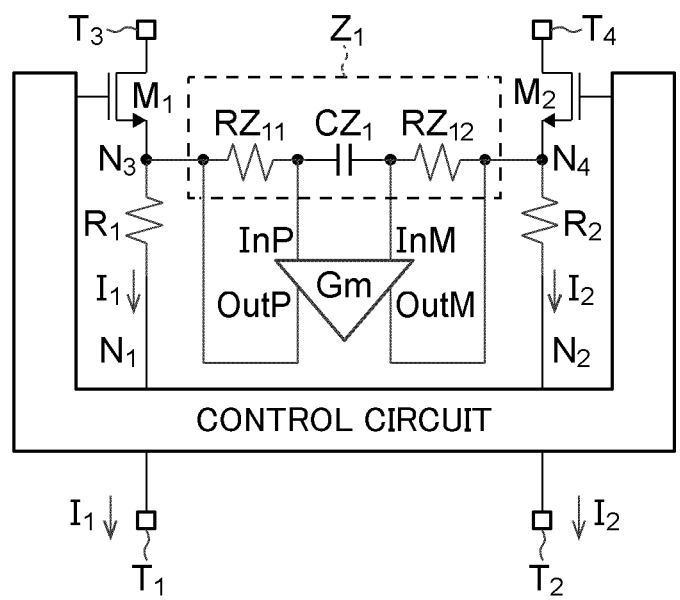
FIG. 47 is a diagram of a current amplifier circuit according to a thirteenth embodiment.

Next, a current amplifier circuit according to a thirteenth embodiment will be described with reference to FIGS. 47 and 48. Here, FIG. 47 is a diagram illustrating the current amplifier circuit according to the thirteenth embodiment. As illustrated in FIG. 47, the current amplifier circuit according to the present embodiment includes a transistor $M_1$, a resistor $R_1$, a transistor $M_2$, a resistor $R_2$, and a control circuit. The configurations of the above components are same as the first embodiment. In the present embodiment, the configuration of the passive element $Z_1$ is different from the first embodiment. In addition, a voltage-current conversion circuit Gm is connected to the passive element $Z_1$.

The passive element $Z_1$ includes a resistor $RZ_{11}$ (third resistor), a capacitor $CZ_1$, and a resistor $RZ_{12}$ (fourth resistor). One end of the resistor $RZ_{11}$ is connected to one end of the resistor $R_1$ and the source terminal of the transistor $M_1$ at the node $N_3$, and the other end is connected to one end of the capacitor $CZ_1$. One end of the resistor $RZ_{12}$ is connected to one end of the resistor $R_2$ and the source terminal of the transistor $M_2$ at the node $N_4$, and the other end is connected to the other end of the capacitor $CZ_1$. In other words, the resistor $RZ_{11}$, the capacitor $CZ_1$, and the resistor $RZ_{12}$ are connected in series.

The voltage-current conversion circuit Gm includes two input terminals InP (first input terminal) and InM (second input terminal) and two output terminals OutP (first output terminal) and OutM (second output terminal). The voltage-current conversion circuit Gm converts voltages input from the input terminals InP and InM into currents by a predetermined voltage-current conversion coefficient Gm, and outputs the converted currents to the output terminals OutP and OutM, respectively.

The input terminal InP of the voltage-current conversion circuit Gm is connected to the other end of the resistor $RZ_{11}$, the output terminal OutP is connected to one end of the resistor $RZ_{11}$, the input terminal InM is connected to the other end of the resistor $RZ_{12}$, and the output terminal OutM is connected to one end of the resistor $RZ_{12}$.

In the present embodiment, a voltage $V_3$ at the node $N_3$ becomes $V_3 = V_1 + R_1 I_1$, and a voltage $V_4$ at the node $N_4$ becomes $V_4 = V_2 + R_2 I_2$. Here, for example, in the case where $R_1 = R_2 = R_C$, $I_1 = I_{b1}(1+\Delta_R)$, $I_2 = I_{b2}(1-\Delta_R)$, and $V_1 = V_2 = V_C$, the voltages $V_3$ and $V_4$ become: $V_3 = V_C + R_C I_{b1} + R_C I_{b1} \Delta_R$, and $V_4 = V_C + R_C I_{b2} - R_C I_{b2} \Delta_R$.

Therefore, a voltage applied to the passive element $Z_1$ becomes $V_3 - V_4 = R_C(I_{b1} - I_{b2}) + R_C(I_{b1} + I_{b2})\Delta_R$. In other words, the signal components $R_C(I_{b1}+I_{b2})\Delta_R$ and $R_C(I_{b1}-I_{b2})$ are applied to the passive element $Z_1$. $R_C(I_{b1}-I_{b2})$ is a direct current offset voltage generated by deviation in bias current $I_{b1}$ and $I_{b2}$ contained in the current $I_1$ and $I_2$.

In the current amplifier circuit according to the present embodiment, since the passive element $Z_1$ is configured by the resistor $RZ_{11}$, the capacitor $CZ_1$, and the resistor $RZ_{12}$ connected in series, the direct current offset voltage is not converted into the current. Therefore, according to the present embodiment, the power consumption of the current amplifier circuit can be reduced.

In addition, the direct current offset voltage applied to the capacitor $CZ_1$ can be converted into the current by the voltage-current conversion circuit Gm, and supplied to the transistors $M_1$ and $M_2$. At this time, the current is desirably supplied such that a difference between the drain current $I_{M1}$ of the transistor $M_1$ and the drain current $I_{M2}$ of the transistor $M_2$ becomes small.

For example, when the voltage-current conversion coefficient is $Gm = \frac{1}{2}R_C$, the output current of the voltage-current conversion circuit Gm becomes $\pm(I_{b1}-I_{b2})/2$. When $-(I_{b1}-I_{b2})/2$ is supplied to the transistor $M_1$, the bias current of the transistor $M_1$ becomes $I_{b1}-(I_{b1}-I_{b2})/2 = (I_{b1}+I_{b2})/2$. In addition, when $+(I_{b1}-I_{b2})/2$ is supplied to the transistor $M_2$, the bias current of the transistor $M_2$ becomes $I_{b2}+(I_{b1}-I_{b2})/2 = (I_{b1}+I_{b2})/2$. In other words, the transistors $M_1$ and $M_2$ can be equalized in the bias current. Due to this, a direct current offset component contained in a difference between the current $I_{M1}$ and the current $I_{M2}$ respectively output from the output terminals $T_3$ and $T_4$ can be reduced.

Figure 48:
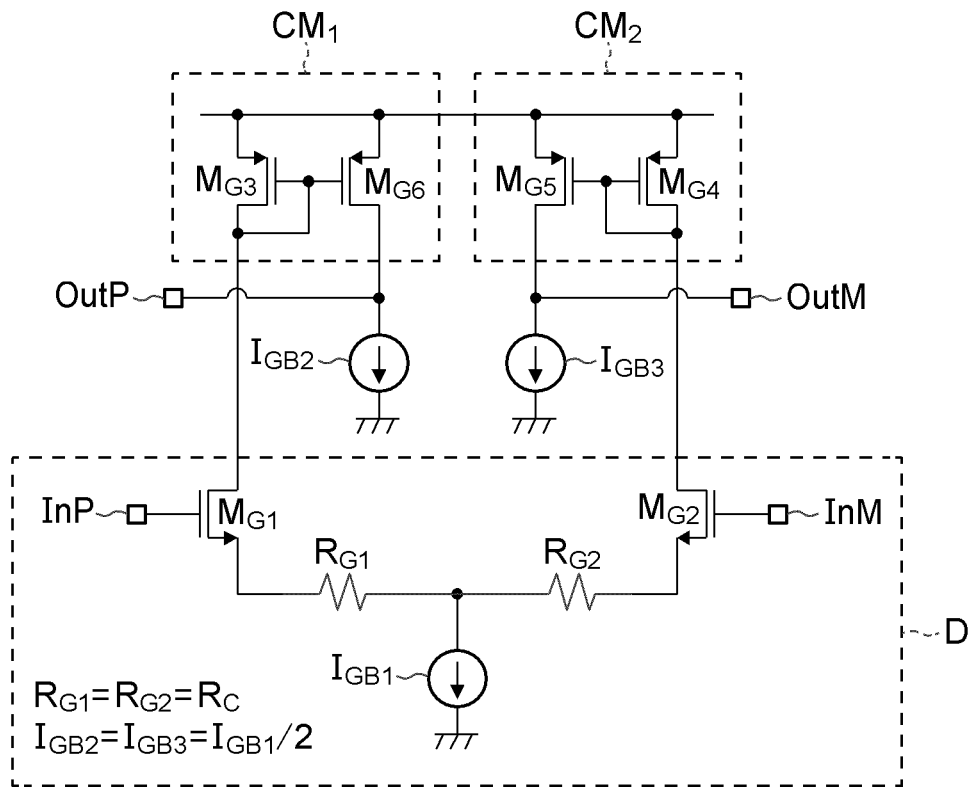
FIG. 48 is a diagram illustrating an example of a voltage-current conversion circuit in FIG. 47.

Here, FIG. 48 is a diagram illustrating an example of the voltage-current conversion circuit Gm according to the present embodiment. As illustrated in FIG. 48, the voltage-current conversion circuit Gm includes a differential input circuit D, current mirror circuits $CM_1$ and $CM_2$, and current sources $I_{GB2}$ and $I_{GB3}$.

The differential input circuit D includes transistors $M_{G1}$ and $M_{G2}$, resistors $R_{G1}$ and $R_{G2}$, and a current source $I_{GB1}$. The transistor $M_{G1}$ is an NMOS transistor, having a drain terminal connected to the current mirror circuit $CM_1$, a gate terminal connected to the input terminal InP, and a source terminal connected to one end of the resistor $R_{G1}$. The transistor $M_{G2}$ is an NMOS transistor, having a drain terminal connected to the current mirror circuit $CM_2$, a gate terminal connected to the input terminal InM, and a source terminal connected to one end of the resistor $R_{G2}$. The resistors $R_{G1}$ and $R_{G2}$ both have other ends connected to a high voltage side of the current source $I_{GB1}$.

The current mirror circuit $CM_1$ is configured by transistors $M_{G3}$ and $M_{G6}$, and copies the drain current $I_{MG1}$ of the transistor $M_{G1}$. The transistors $M_{G3}$ and $M_{G6}$ are PMOS transistors, having the gate terminals connected to each other. The drain terminal of the transistor $M_{G6}$ is connected to the output terminal OutP and a high voltage side of the current source $I_{GB2}$. Due to this, a difference between the drain current $I_{MG1}$ and the current $I_{GB2}$ supplied by the current source $I_{GB2}$, that is, the current corresponding to a change in voltage input from the input terminal InP is output from the output terminal OutP.

The current mirror circuit $CM_2$ is configured by transistors $M_{G4}$ and $M_{G5}$, and copies the drain current $I_{MG2}$ of the transistor $M_{G2}$. The transistors $M_{G4}$ and $M_{G5}$ are PMOS transistors, having the gate terminals connected to each other. The drain terminal of the transistor $M_{G5}$ is connected to the output terminal OutM and a high voltage side of the current source $I_{GB3}$. Due to this, a difference between the drain current $I_{MG2}$ and the current $I_{GB3}$ supplied by the current source $I_{GB3}$, that is, the current corresponding to a change in voltage input from the input terminal InM is output from the output terminal OutM.

Here, by setting $R_{G1} = R_{G2} = R_C$, $I_{GB2} = I_{GB3} = I_{GB1}/2$, and by setting transconductances $gm_{MG1}$ and $gm_{MG2}$ of the transistors $M_{G1}$ and $M_{G2}$ to $1/gm_{MG1} \ll R_C$ and $1/gm_{MG2} \ll R_C$, the voltage-current conversion coefficient Gm in the differential input circuit can be set to $\frac{1}{2}R_C$.

(Fourteenth Embodiment)

Figure 49:
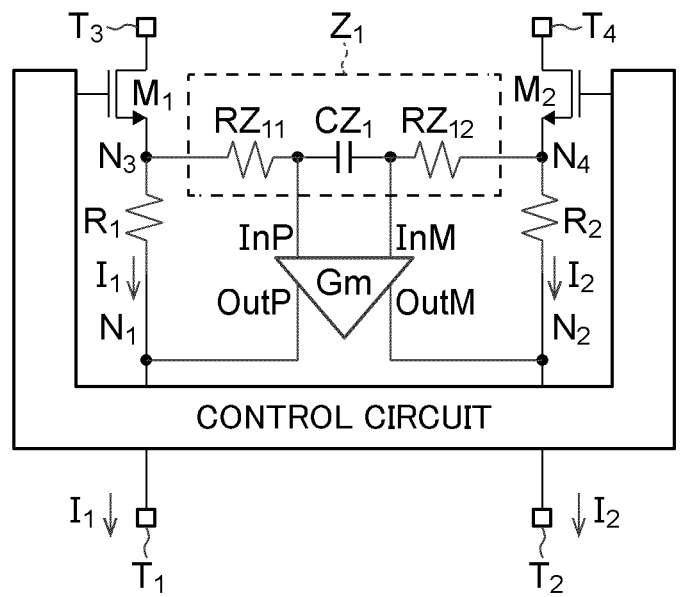
FIG. 49 is a diagram of a current amplifier circuit according to a fourteenth embodiment.

Next, a current amplifier circuit according to a fourteenth embodiment will be described with reference to FIGS. 49 and 50. Here, FIG. 49 is a diagram illustrating the current amplifier circuit according to the fourteenth embodiment. As illustrated in FIG. 49, the current amplifier circuit according to the present embodiment includes a transistor $M_1$, a resistor $R_1$, a transistor $M_2$, a resistor $R_2$, a control circuit, a passive element $Z_1$, and the voltage-current conversion circuit Gm. The voltage-current conversion circuit Gm of the present embodiment is different from the thirteenth embodiment in the connection method.

In the present embodiment, the output terminal OutP (the first output terminal) is connected to the other end of the resistor $R_1$ and the control circuit at a node $N_1$, and the output terminal OutM (the second output terminal) is connected to the other end of the resistor $R_2$ and the control circuit at a node $N_2$. The configurations of other components are same as the thirteenth embodiment.

In the present embodiment, a voltage $V_3$ at a node $N_3$ becomes $V_3=V_1+R_1(I_1-I_{Gm})$, and a voltage $V_4$ at a node $N_4$ becomes $V_4=V_2+R_2(I_2+I_{Gm})$. Here, $-I_{Gm}$ and $+I_{Gm}$ are the output current from the output terminals OutP and OutM of the voltage-current conversion circuit Gm. For example, in the case where $R_1=R_2=R_C$, $I_1=I_{b1}(1+\Delta_R)$, $I_2=I_{b2}(1-\Delta_R)$, $V_1=V_2=V_C$, the voltages $V_3$ and $V_4$ become: $V_3=V_C+R_CI_{b1}-R_CI_{Gm}+R_CI_{b1}\Delta_R$, and $V_4=Vc+R_CI_{b2}+R_CI_{Gm}-R_CI_{b2}\Delta_R$.

Therefore, a voltage applied to the passive element $Z_1$ becomes $V_3-V_4=R_C(I_{b1}-I_{b2})-2R_CI_{Gm}+R_C(I_{b1}+I_{b2})\Delta_R$. In other words, the signal component $R_C(I_{b1}+I_{b2})\Delta_R$, the direct current offset voltage $R_C(I_{b1}-I_{b2})$, and a voltage $-2R_CI_{Gm}$ according to the output current of the voltage-current conversion circuit Gm are applied to the passive element $Z_1$.

Since $I_{Gm}$ is obtained by converting the direct current offset voltage into the current by the voltage-current conversion coefficient Gm, a relation of $I_{Gm}=Gm(R_C(I_{b1}-I_{b2})-2R_CI_{Gm})$ is satisfied. In a case where Gm is sufficiently large and $2GmR_C\gg1$, the current $I_{Gm}$ becomes: $I_{Gm}\approx(I_{b1}-I_{b2})/2$, and the both bias currents flowing to the resistors $R_1$ and $R_2$ become equal to $(I_{b1}+I_{b2})/2$. Due to this, it is possible to reduce the direct current offset component contained in a difference between the current $I_{M1}$ and the current $I_{M2}$ output from output terminals $T_3$ and $T_4$ respectively.

Figure 50:
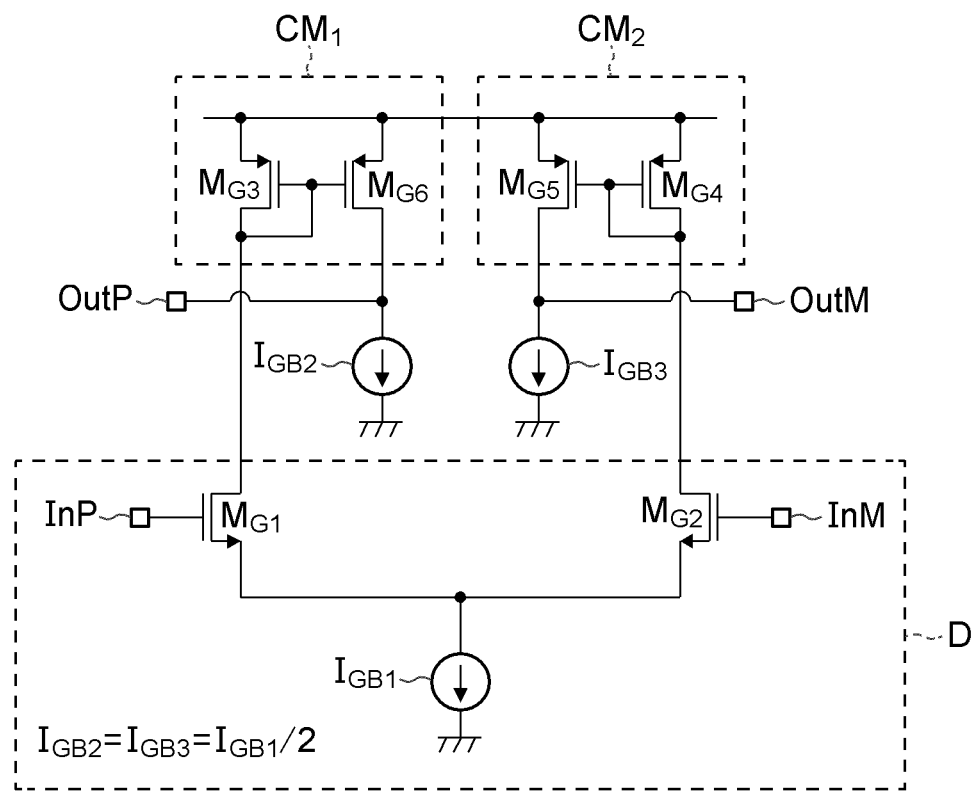
FIG. 50 is a diagram illustrating an example of a voltage-current conversion circuit in FIG. 49.

Here, FIG. 50 is a diagram illustrating an example of the voltage-current conversion circuit Gm according to the present embodiment. As illustrated in FIG. 50, the voltage-current conversion circuit Gm includes the differential input circuit D, the current mirror circuits $CM_1$ and $CM_2$, and current sources $I_{GB2}$ and $I_{GB3}$. The voltage-current conversion circuit Gm of FIG. 50 is different from the voltage-current conversion circuit Gm of FIG. 48 in the configuration of the differential input circuit D.

The differential input circuit D includes transistors $M_{G1}$ and $M_{G2}$ and a current source $I_{GB1}$. The transistor $M_{G1}$ is an NMOS transistor, having a drain terminal connected to the current mirror circuit $CM_1$, a gate terminal connected to an input terminal InP, and a source terminal connected to a high voltage side of the current source $I_{GB1}$. The transistor $M_{G2}$ is an NMOS transistor, having a drain terminal connected to the current mirror circuit $CM_2$, a gate terminal connected to an input terminal InM, and a source terminal connected to a high voltage side of the current source $I_{GB2}$. In other words, the voltage-current conversion circuit Gm of FIG. 50 is different from the voltage-current conversion circuit Gm of FIG. 48, and does not include the resistors $R_{G1}$ and $R_{G2}$.

Therefore, in the voltage-current conversion circuit Gm of FIG. 50, a change of the output current with respect to the change of the input voltage is large compared to the voltage-current conversion circuit Gm of FIG. 48. In other words, the voltage-current conversion coefficient Gm is large. This is because, unlike the case of the thirteenth embodiment, the voltage-current conversion coefficient Gm is desirably large in the case of the present embodiment.

(Fifteenth Embodiment)

Figure 51:
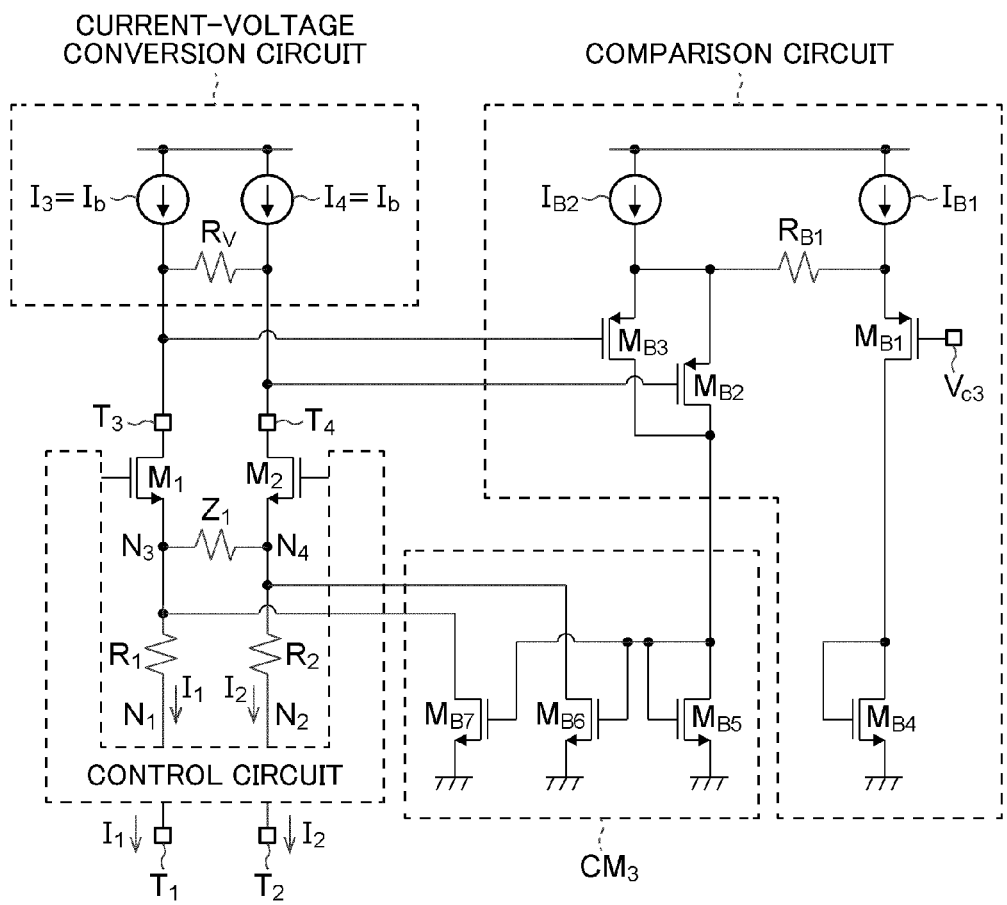
FIG. 51 is a diagram of a current amplifier circuit according to a fifteenth embodiment.

Next, a current amplifier circuit according to a fifteenth embodiment will be described with reference to FIGS. 51 to 53. Here, FIG. 51 is a diagram illustrating the current amplifier circuit according to the fifteenth embodiment. As illustrated in FIG. 51, the current amplifier circuit according to the present embodiment includes a transistor $M_1$, a resistor $R_1$, a transistor $M_2$, a resistor $R_2$, a control circuit, the passive element $Z_1$, and a current-voltage conversion circuit. The configurations of the above components are same as the tenth embodiment. In the present embodiment, the current amplifier circuit further includes a comparison circuit and a current mirror circuit $CM_3$.

The comparison circuit compares the output voltages from output terminals $T_3$ and $T_4$ with a predetermined voltage (fourth predetermined voltage), and outputs the current according to the comparison result. The comparison circuit includes transistors $M_{B1}$, $M_{B2}$, $M_{B3}$, and $M_{B4}$, a resistor $R_{B1}$, and current sources $I_{B1}$ and $I_{B2}$.

The transistor $M_{B1}$ is a PMOS transistor, having a source terminal connected to one end of the resistor $R_{B1}$ and a low voltage side of the current source $I_{B1}$, a gate terminal from which a predetermined bias voltage $V_{C3}$ is applied, and a drain terminal connected to the drain terminal of the transistor $M_{B4}$. A bias voltage $V_{C3}$ is set to be lower than the bias voltage of the output voltages from the output terminals $T_3$ and $T_4$.

The transistor $M_{B2}$ is a PMOS transistor, having a source terminal connected to the other end of the resistor $R_{B1}$, the source terminal of the transistor $M_{B3}$, and a low voltage side of the current source $I_{B2}$, a gate terminal connected to the output terminal $T_4$, and a drain terminal connected to the drain terminal of the transistor $M_{B3}$ and the current mirror circuit $CM_3$.

The transistor $M_{B3}$ is a PMOS transistor, having a source terminal connected to the other end of the resistor $R_{B1}$, the source terminal of the transistor $M_{B2}$, and the low voltage side of the current source $I_{B2}$, a gate terminal connected to the output terminal $T_3$, a drain terminal connected to the drain terminal of the transistor $M_{B2}$ and the current mirror circuit $CM_3$.

The transistor $M_{B4}$ is an NMOS transistor, having a source terminal grounded, a drain terminal connected to the drain terminal of the transistor $M_{B1}$, and a gate terminal connected to the drain terminal.

The current mirror circuit $CM_3$ includes transistors $M_{B5}$, $M_{B6}$, and $M_{B7}$. The transistors $M_{B5}$, $M_{B6}$, and $M_{B7}$ are NMOS transistors, each of which the gate terminal is connected to each other and the source terminal is grounded. In addition, the drain terminal of the transistor $M_{B5}$ is connected to the drain terminals of the transistors $M_{B2}$ and $M_{B3}$, and the drain terminals of the transistors $M_{B6}$ and $M_{B7}$ are respectively connected to nodes $N_4$ and $N_3$.

Next, the operation of the current amplifier circuit according to the present embodiment will be described. In the following, the signal current is differentially received from input terminals $T_1$ and $T_2$.

First, the current-voltage conversion circuit converts the drain current $I_{M1}$ and the drain current $I_{M2}$ of the transistors $M_1$ and $M_2$ into voltages. The voltages converted by the current-voltage conversion circuit are output from the output terminals $T_3$ and $T_4$, and input to the comparison circuit.

Next, the comparison circuit compares the output voltages (the gate voltages of the transistors $M_{B3}$ and $M_{B2}$) of the output terminals $T_3$ and $T_4$ with a predetermined voltage. In a case where the signal components contained in the output voltages are sufficiently small, that is, the output voltages are sufficiently higher than the predetermined voltage, all the current $I_{B2}$ of the current source $I_{B2}$ flows to the resistor $R_{B1}$, the transistors $M_{B3}$ and $M_{B2}$ are turned off, and the current does not flow to the current mirror circuit $CM_3$.

On the other hand, in a case where the signal components contained in the output voltages are small and the output voltages are higher than the predetermined voltage but a difference between the voltage at the other end of the resistor $R_{B1}$ and the voltage at one end of the resistor $R_{B1}$ is smaller than $R_{B1}I_{B2}$, a part of current of the current $I_{B2}$ of the current source $I_{B2}$ starts to flow to the transistors $M_{B2}$ and $M_{B3}$, and flows to the current mirror circuit $CM_3$. When the output voltages are further lowered and become smaller than the predetermined voltage, all the current $I_{B2}$ of the current source $I_{B2}$ and a part of the current $I_{B1}$ of the current source $I_{B1}$ start to flow to the transistors $M_{B2}$ and $M_{B3}$, and flow to the current mirror circuit $CM_3$. Thus, the current flowing to the current mirror circuit $CM_3$ is increased as the output voltages become small, that is, the signal components contained in the output voltages become large.

Since the output voltages are differentially input to the transistors $M_{B2}$ and $M_{B3}$, in a case where the signal components contained in the output voltages are sufficiently larger, one of the transistor $M_{B2}$ or the transistor $M_{B3}$ is turned on and the other one is turned off. Then, the drain current of the turned-on transistor is supplied to the transistor $M_{B5}$.

The current output by the comparison circuit becomes the drain current $I_{MB5}$ of the transistor $M_{B5}$. The drain current $I_{MB5}$ is copied by the transistors $M_{B7}$ and $M_{B6}$, and supplied from nodes $N_3$ and $N_4$ to the transistors $M_1$ and $M_2$.

With this configuration, in a case where the signal current contained in the current $I_1$ and $I_2$ is larger, the current amplifier circuit according to the present embodiment supplies the current to the transistors $M_1$ and $M_2$, and drive performance can be improved. Therefore, an amplification factor of the signal component can be improved.

As described in the first embodiment, the drain current $I_{M1}$ of the transistor $M_1$ is $I_{M1} = I_1 + I_{Z1} = I_b + \Delta_R I_b + 2R_C I_b \Delta_R / Z_1$, the drain current $I_{M2}$ flowing to the transistor $M_2$ is $I_{M2} = I_2 - I_{Z1} = I_b - \Delta_R I_b - 2R_C I_b \Delta_R / Z_1$. Therefore, in the current amplifier circuit of the first embodiment, the signal current contained in the output current from the output terminals $T_3$ and $T_4$ is not possible to become larger than the bias current $I_b$.

However, according to the present embodiment, since the current can be supplied to the transistors $M_1$ and $M_2$ through the current mirror circuit $CM_3$, it is possible to make the signal current contained in the output current larger than the bias current $I_b$.

In addition, the output current from the comparison circuit is smoothly changed by connecting the resistor $R_{B1}$ between the transistor $M_{B1}$ and the transistors $M_{B2}$ and $M_{B3}$, and the deformation of the output current from the comparison circuit can be suppressed.

Figure 52:
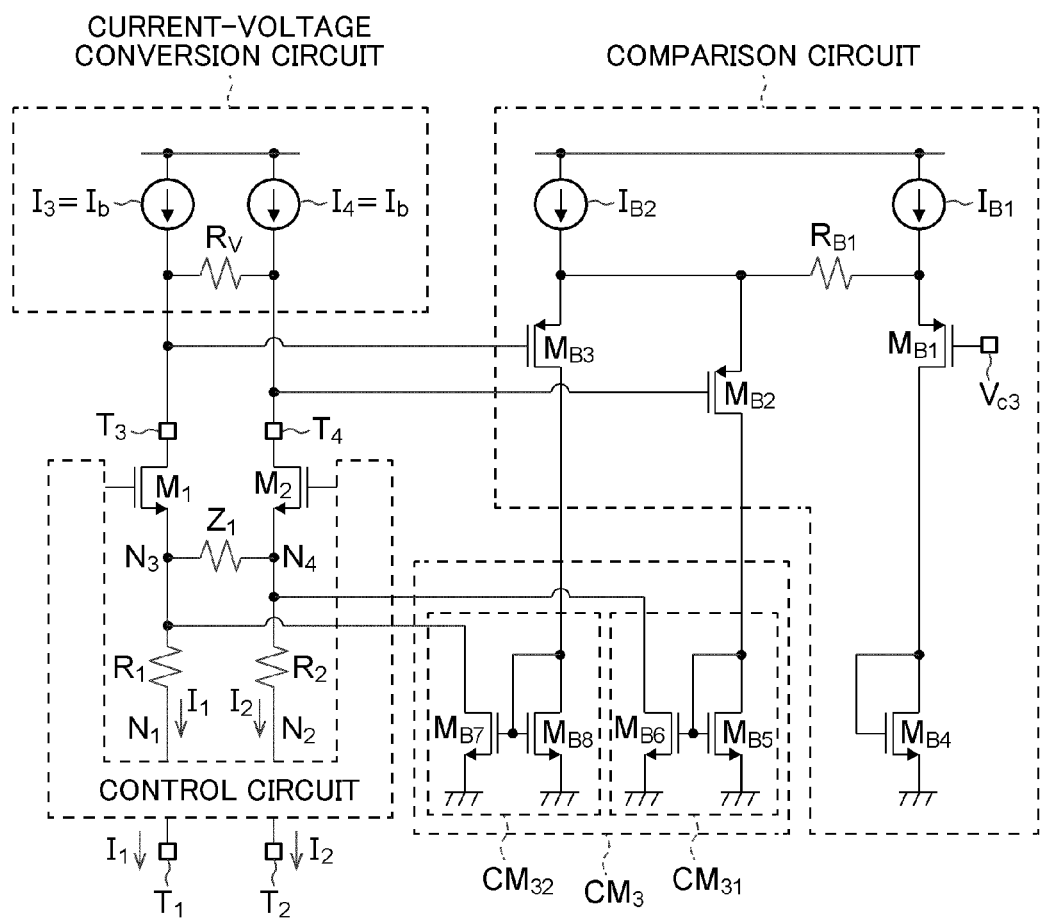
FIGS. 52 and 53 are diagrams illustrating another example of the current amplifier circuit in FIG. 51.

FIG. 52 is a diagram illustrating another example of the current amplifier circuit according to the present embodiment. In FIG. 52, the drain terminal of the transistor $M_{B2}$ of the comparison circuit and the drain terminal of the transistor $M_{B3}$ are not connected, and they are connected to the current mirror circuit $CM_3$, respectively. The current mirror circuit $CM_3$ includes a first current mirror circuit $CM_{31}$ and a second current mirror circuit $CM_{32}$.

The first current mirror circuit $CM_{31}$ includes the transistor $M_{B5}$ and the transistor $M_{B6}$. The transistor $M_{B5}$ has a drain terminal connected to a gate terminal and the drain terminal of the transistor $M_{B2}$, the gate terminal connected to the gate terminal of the transistor $M_{B6}$, and a source terminal grounded. The transistor $M_{B6}$ has a drain terminal connected to a node $N_4$, a gate terminal connected to the gate terminal of the transistor $M_{B5}$, and a source terminal grounded. A first current mirror circuit $CM_{31}$ copies the drain current $I_{MB2}$ of the transistor $M_{B2}$ and supplies the current from the node $N_4$ to the transistor $M_2$.

The second current mirror circuit $CM_{32}$ includes a transistor $M_{B7}$ and a transistor $M_{B8}$. The transistor $M_{B8}$ has a drain terminal connected to a gate terminal and the drain terminal of the transistor $M_{B3}$, the gate terminal connected to the gate terminal of the transistor $M_{B7}$, and a source terminal grounded. The transistor $M_{B7}$ has a drain terminal connected to a node $N_3$, a gate terminal connected to the gate terminal of the transistor $M_{B8}$, and a source terminal grounded. A second current mirror circuit $CM_{32}$ copies the drain current $I_{MB3}$ of the transistor $M_{B3}$ and supplies the current from the node $N_3$ to the transistor $M_1$.

The configurations of other components are same as the current amplifier circuit of FIG. 51. With this configuration, it is possible to supply the current only to the transistor $M_1$ or the transistor $M_2$ outputting the lower voltage in the output voltages from the output terminals $T_3$ and $T_4$.

Figure 53:
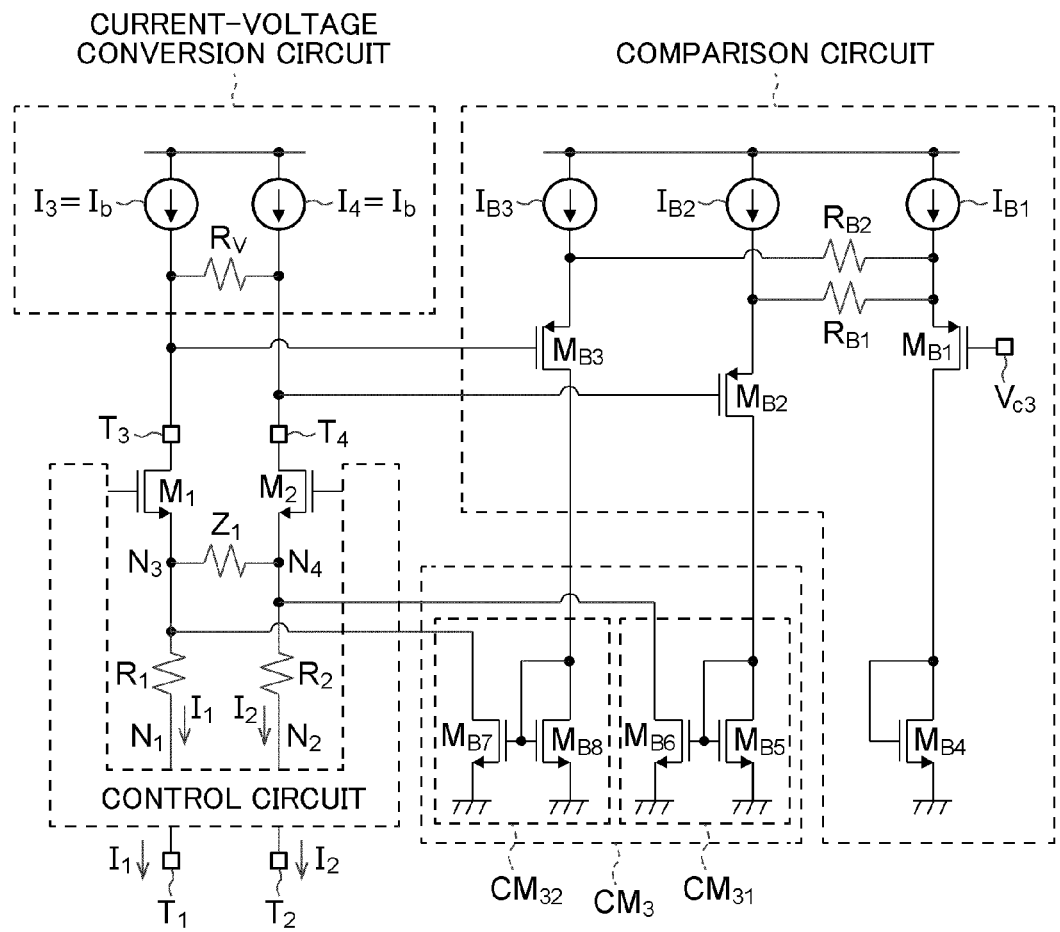

FIG. 53 is a diagram illustrating another example of the current amplifier circuit according to the present embodiment. In FIG. 53, the comparison circuit further includes a resistor $R_{B2}$ and a current source $I_{B3}$. The transistor $M_{B2}$ has a source terminal connected to one end of the resistor $R_{B1}$ and a lower voltage side of the current source $I_{B2}$, a gate terminal connected to the output terminal $T_4$, and a drain terminal connected to the current mirror circuit $CM_{31}$. The transistor $M_{B3}$ has a source terminal connected to one end of the resistor $R_{B2}$ and a lower voltage side of the current source $I_{B3}$, a gate terminal connected to the output terminal $T_3$, and a drain terminal connected to the current mirror circuit $CM_{32}$. The configurations of other components are same as FIG. 52.

With this configuration, it is possible to supply the current only to the transistor $M_1$ or the transistor $M_2$ outputting the lower voltage in the output voltages from the output terminals $T_3$ and $T_4$. In addition, it is possible to separately set a voltage to be used for comparison with the output voltage from the output terminal $T_3$ and a voltage to be used for comparison with the output voltage from the output terminal $T_4$. Furthermore, it is possible to separately set current to be supplied from the node $N_3$ and current to be supplied from the node $N_4$.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A current amplifier circuit, comprising:
a first transistor having a first terminal, a second terminal, and a control terminal;
a first resistor having one end connected to the first terminal of the first transistor;

a second transistor having a first terminal, a second terminal, and a control terminal;

a second resistor having one end connected to the first terminal of the second transistor;

a first passive element connected between the first terminal of the first transistor and the first terminal of the second transistor; and a control circuit to control at least one of voltage at the control terminal of the first transistor and voltage at the control terminal of the second transistor such that voltage at an other end of the first resistor becomes equal to a first predetermined voltage and voltage at an other end of the second resistor becomes equal to a second predetermined voltage.

2. The circuit according to claim 1, wherein the first predetermined voltage is equal to the second predetermined voltage.

3. The circuit according to claim 1, further comprising:

a third transistor having a first terminal, a second terminal, and a control terminal connected to the control terminal of the first transistor;

a fourth transistor having a first terminal, a second terminal, and a control terminal connected to the control terminal of the second transistor; and a second passive element connected between the first terminal of the third transistor and the first terminal of the fourth transistor, wherein the second terminal of the third transistor is connected to the second terminal of the first transistor, and the second terminal of the fourth transistor is connected to the second terminal of the second transistor.

4. The circuit according to claim 1, further comprising:

a third transistor having a first terminal, a second terminal, and a control terminal connected to the first terminal of the first transistor;

a fourth transistor having a first terminal, a second terminal, and a control terminal connected to the first terminal of the second transistor; and a second passive element connected between the first terminal of the third transistor and the first terminal of the fourth transistor, wherein the second terminal of the third transistor is connected to the second terminal of the first transistor, and the second terminal of the fourth transistor is connected to the second terminal of the second transistor.

5. The circuit according to claim 1, comprising a switching circuit to switch a path such that current flowing in the first transistor and current flowing in the second transistor alternately is switched.

6. The circuit according to claim 5, the switching circuit comprising:

a first switch to switch the path between a path of current output from the second terminal of the first transistor and a path of current output from the second terminal of the second transistor; and a second switch to switch the path between a path of current received from the other end of the first resistor and a path of current received from the other end of the second resistor.

7. The circuit according to claim 5, the switching circuit comprising:

a first switch to switch the path between a path of current output from the second terminal of the first transistor and a path of current output from the second terminal of the second transistor;

a third switch to switch the path between a path of current output from the one end of the first resistor and a path of current output from the one end of the second resistor;

a fourth switch to switch a path of voltage received in the control circuit in order to control voltage at a gate terminal of the first transistor; and a fifth switch to switch a path of voltage received in the control circuit in order to control voltage at a gate terminal of the second transistor.

8. The circuit according to claim 1, further comprising:

a fifth transistor having a first terminal connected to a first input terminal, a second terminal connected to the other end of the first resistor, and a control terminal applied with a third predetermined voltage, and a sixth transistor having a first terminal connected to a second input terminal, a second terminal connected to the other end of the second resistor, and a control terminal applied with the third predetermined voltage.

9. The circuit according to claim 1, wherein the first passive element includes a third resistor having one end connected to the first terminal of the first transistor, a fourth resistor having one end connected to the first terminal of the second transistor, and a capacitor connected between an other end of the third resistor and an other end of the fourth resistor, the circuit further comprising:

a voltage-current conversion circuit having a first output terminal connected to the one end of the third resistor, a first input terminal connected to the other end of the third resistor, a second output terminal connected to the one end of the fourth resistor, and a second input terminal connected to the other end of the fourth resistor.

10. The circuit according to claim 1, wherein the first passive element includes a third resistor having one end connected to the first terminal of the first transistor, a fourth resistor having one end connected to the first terminal of the second transistor, and a capacitor connected between an other end of the third resistor and an other end of the fourth resistor, the circuit further comprising:

a voltage-current conversion circuit having a first output terminal connected to the other end of the first resistor, a first input terminal connected to the other end of the third resistor, a second output terminal connected to the other end of the second resistor, and a second input terminal connected to the other end of the fourth resistor.

11. The circuit according to claim 1, further comprising:

a current-voltage conversion circuit to convert drain current of the first transistor and the second transistor into voltage;

a comparison circuit to compare the voltage converted by the current-voltage conversion circuit with a fourth predetermined voltage; and a current mirror circuit to supply current according to a comparison result of the comparison circuit to at least one of the first transistor and the second transistor.

12. The circuit according to claim 1, wherein impedance of the first passive element is variable.

13. The circuit according to claim 1, wherein the control terminal is a gate terminal or a base terminal, the first terminal is a source terminal or an emitter terminal, and the second terminal is a drain terminal or a collector terminal.

14. An integrator, comprising:
a current amplifier circuit according to claim 1; and
a capacitor element to integrate an output signal of the current amplifier circuit.

15. The integrator according to claim 14, wherein the capacitor element is formed including capacitor connected between the second terminal of the first transistor and the second terminal of the second transistor.

16. The integrator according to claim 14, wherein the capacitor element is formed including a first capacitor connected to the second terminal of the first transistor, and a second capacitor connected to the second terminal of the second transistor.

17. An AD converter, comprising:
a current amplifier circuit according to claim 1;
a current-voltage conversion circuit to convert an output signal of the current amplifier circuit to a voltage signal; and
an AD conversion circuit to convert the voltage signal to a digital signal.

18. A current amplifier circuit, comprising:
a first transistor having a first terminal, a second terminal, and a control terminal;
a first resistor having one end connected to the first terminal of the first transistor;
a first passive element connected between the first terminal of the first transistor and reference potential;
a control circuit to control voltage at the control terminal of the first transistor such that the other end of the first resistor becomes a first predetermined voltage:
a second transistor having a first terminal connected to an input terminal, and
a second terminal connected to an other end of the first resistor, and a control terminal applied with a second predetermined voltage.

19. A current amplifier circuit, comprising:
a first transistor having a first terminal, a second terminal, and a control terminal;
a first resistor having one end connected to the first terminal of the first transistor;
a first passive element connected between the first terminal of the first transistor and reference potential; and
a control circuit to control voltage at the control terminal of the first transistor such that the other end of the first resistor becomes a first predetermined voltage, wherein the first passive element is formed including at least a capacitor.

* * * * *